(12) United States Patent
Zoppas et al.

(10) Patent No.: US 12,195,074 B2
(45) Date of Patent: Jan. 14, 2025

(54) STEERING WHEEL SENSOR

(71) Applicant: I.R.C.A. S.P.A. INDUSTRIA RESISTENZE CORAZZATE E AFFINI, Vittorio Veneto (IT)

(72) Inventors: Federico Zoppas, Treviso (IT); Mauro Berioli, Vittorio Veneto (IT); Angelo Morello, Vittorio Veneto (IT); Roberto Oboe, Vicenza (IT); Paolo Magnone, Vicenza (IT)

(73) Assignee: I.R.C.A. S.P.A. INDUSTRIA RESISTENZE CORAZZATE E AFFINI, Vittorio Veneto (IT)

( * ) Notice: Subject to any disclaimer, the term of this patent is extended or adjusted under 35 U.S.C. 154(b) by 753 days.

(21) Appl. No.: 17/296,041

(22) PCT Filed: Dec. 4, 2019

(86) PCT No.: PCT/IB2019/060421
§ 371 (c)(1),
(2) Date: May 21, 2021

(87) PCT Pub. No.: WO2020/115669
PCT Pub. Date: Jun. 11, 2020

(65) Prior Publication Data
US 2022/0009540 A1    Jan. 13, 2022

(30) Foreign Application Priority Data
Dec. 4, 2018   (IT) .......................... 102018000010761

(51) Int. Cl.
*B62D 1/06*     (2006.01)
*B62D 1/04*     (2006.01)
(Continued)

(52) U.S. Cl.
CPC ............. *B62D 1/065* (2013.01); *B62D 1/046* (2013.01); *H03K 17/962* (2013.01); *H05B 1/0236* (2013.01)

(58) Field of Classification Search
CPC .......... B62D 1/06; B62D 1/065; B62D 1/046; H03K 17/962; H03K 2217/96078;
(Continued)

(56) References Cited

U.S. PATENT DOCUMENTS

2008/0308323 A1    12/2008  Huang et al.
2017/0210409 A1*   7/2017   Streifinger ............... G01D 5/24
(Continued)

FOREIGN PATENT DOCUMENTS

DE         102014113128 A1    3/2016

*Primary Examiner* — Logan M Kraft
*Assistant Examiner* — Johnny H Hoang
(74) *Attorney, Agent, or Firm* — Amster, Rothstein & Ebenstein LLP

(57) ABSTRACT

A device (100, 200', 200", 300, 400) for detecting the contact between a user and a steering wheel (9) of a vehicle, the device (100, 200', 200", 300, 400) comprising: an electrically insulating support (10); a first electrically conductive track (101, 201, 301, 401) fastened to the support (10) and comprising a plurality of first peaks (11) alternated with a plurality of first troughs (12) along a direction (D), wherein the first track (101, 201, 301, 401) is distributed over the support so that the surface of the first track (101, 201, 301, 401) adapted to come into contact with a user's hand decreases along said direction (D).

19 Claims, 13 Drawing Sheets

(51) Int. Cl.
*H03K 17/96* (2006.01)
*H05B 1/02* (2006.01)

(58) Field of Classification Search
CPC ............ H03K 2217/96066; H05B 1/02; H05B 1/0236; Y02T 10/20
See application file for complete search history.

(56) References Cited

U.S. PATENT DOCUMENTS

2017/0254675 A1\* 9/2017 Hein ........................ G01L 1/142
2020/0062289 A1\* 2/2020 Zoppas ................ H03K 17/962

\* cited by examiner

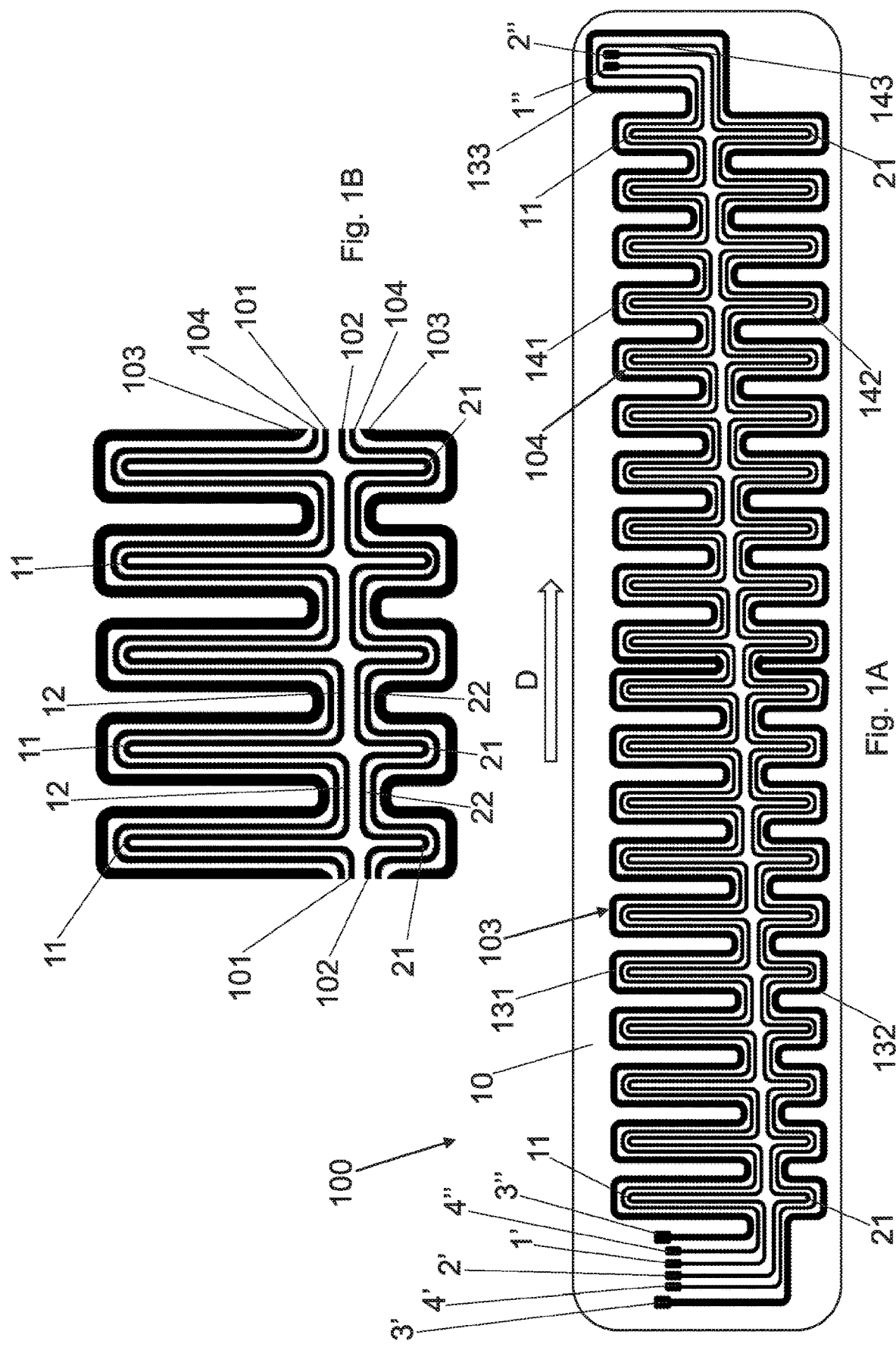

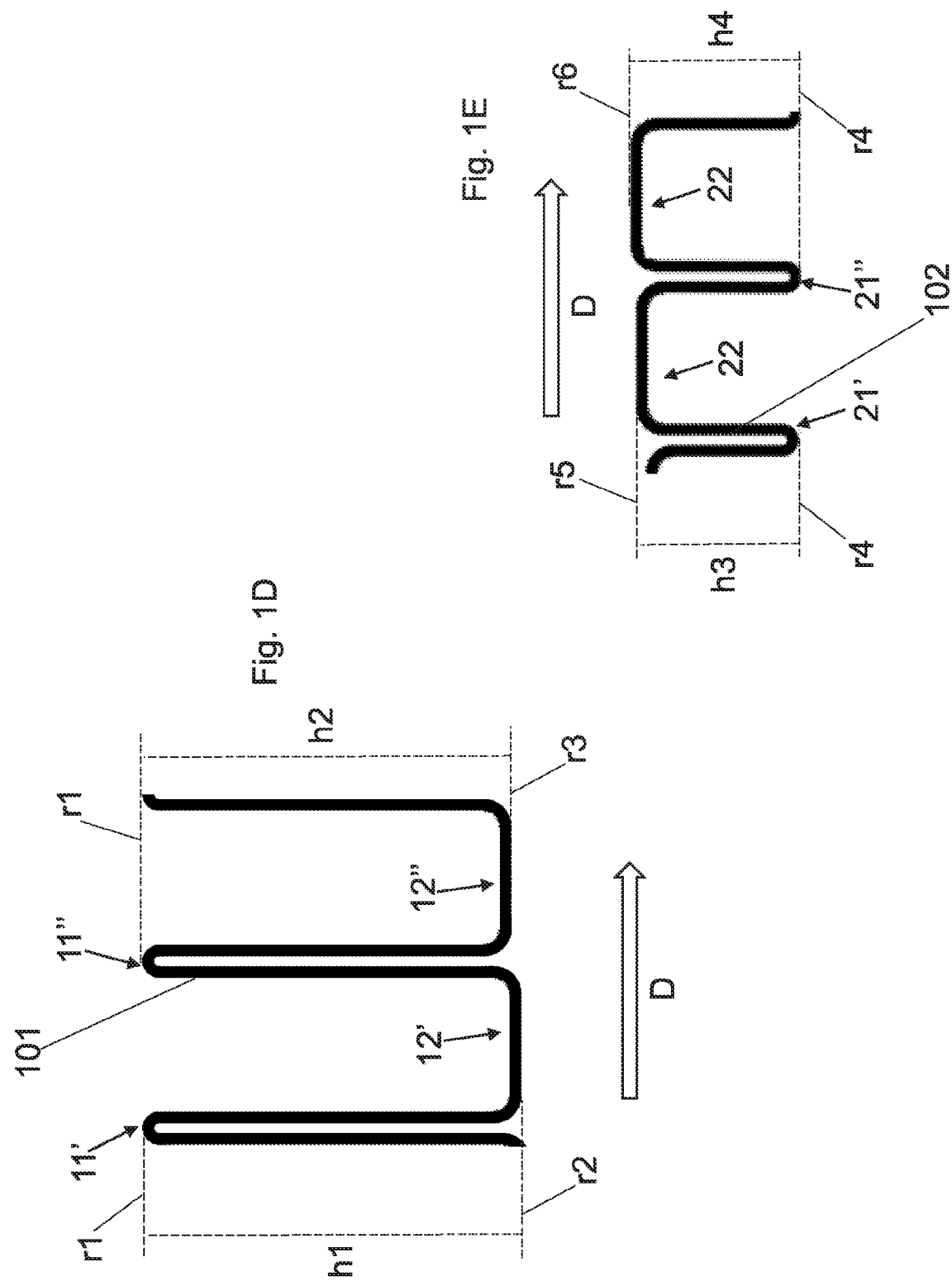

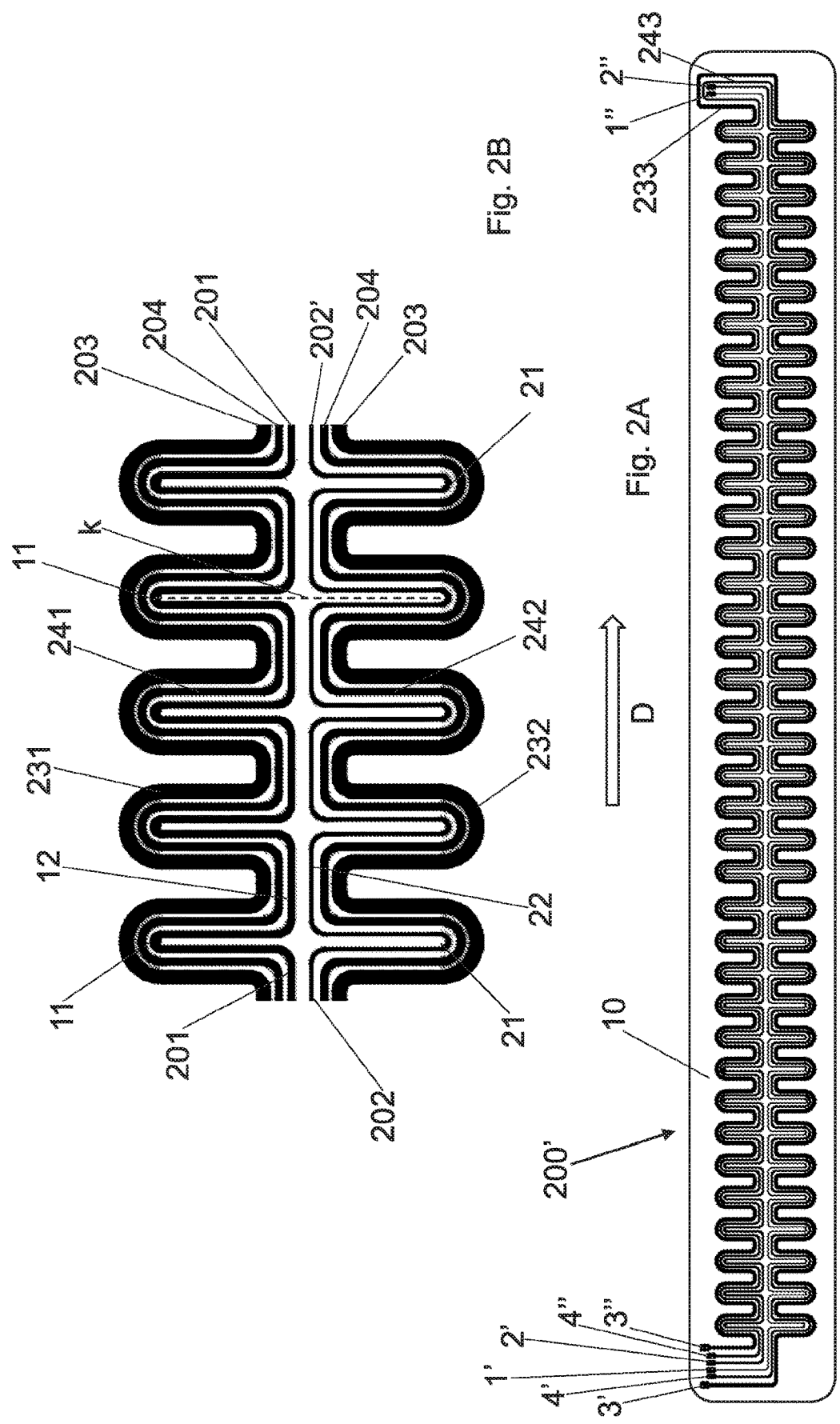

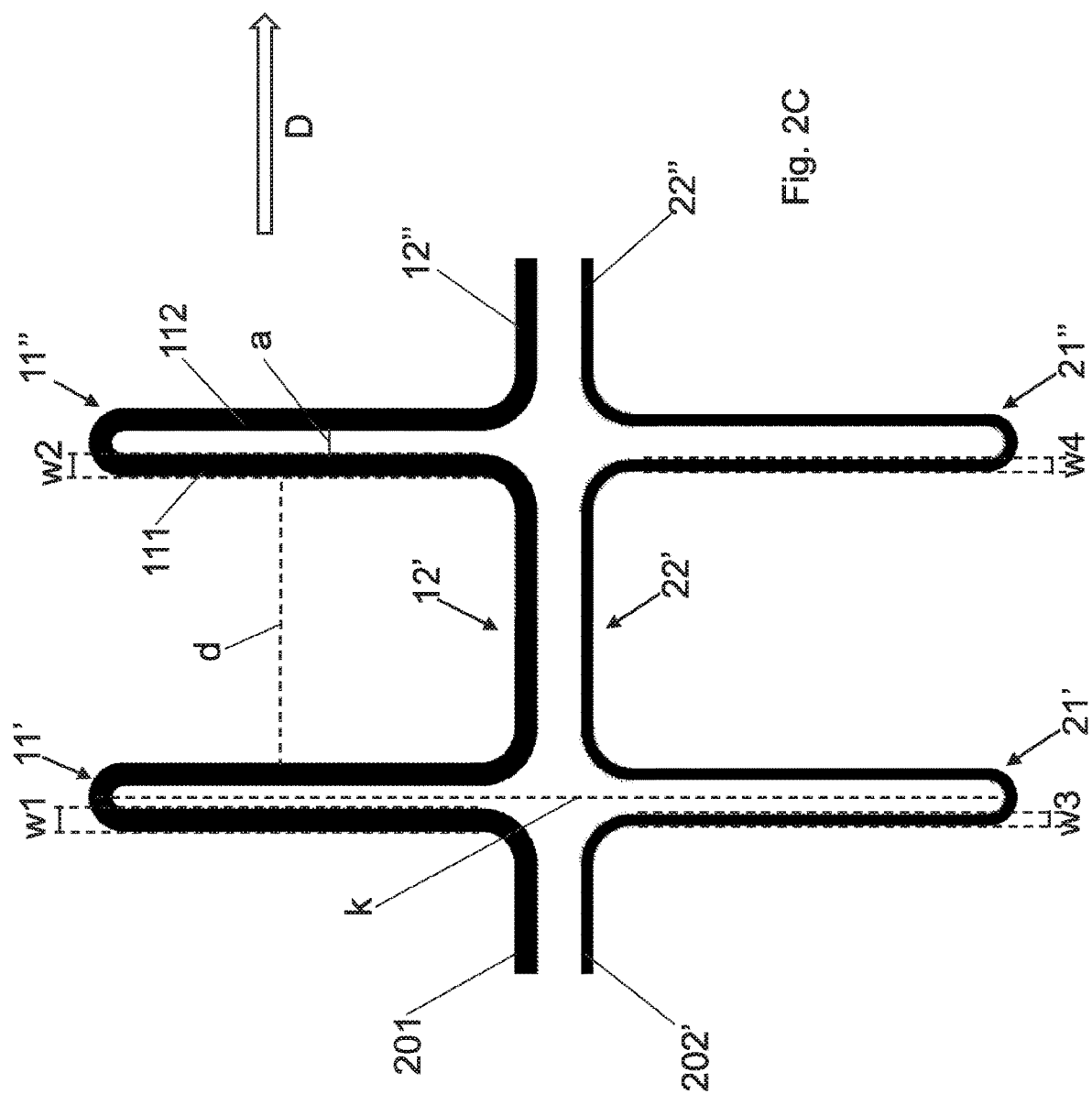

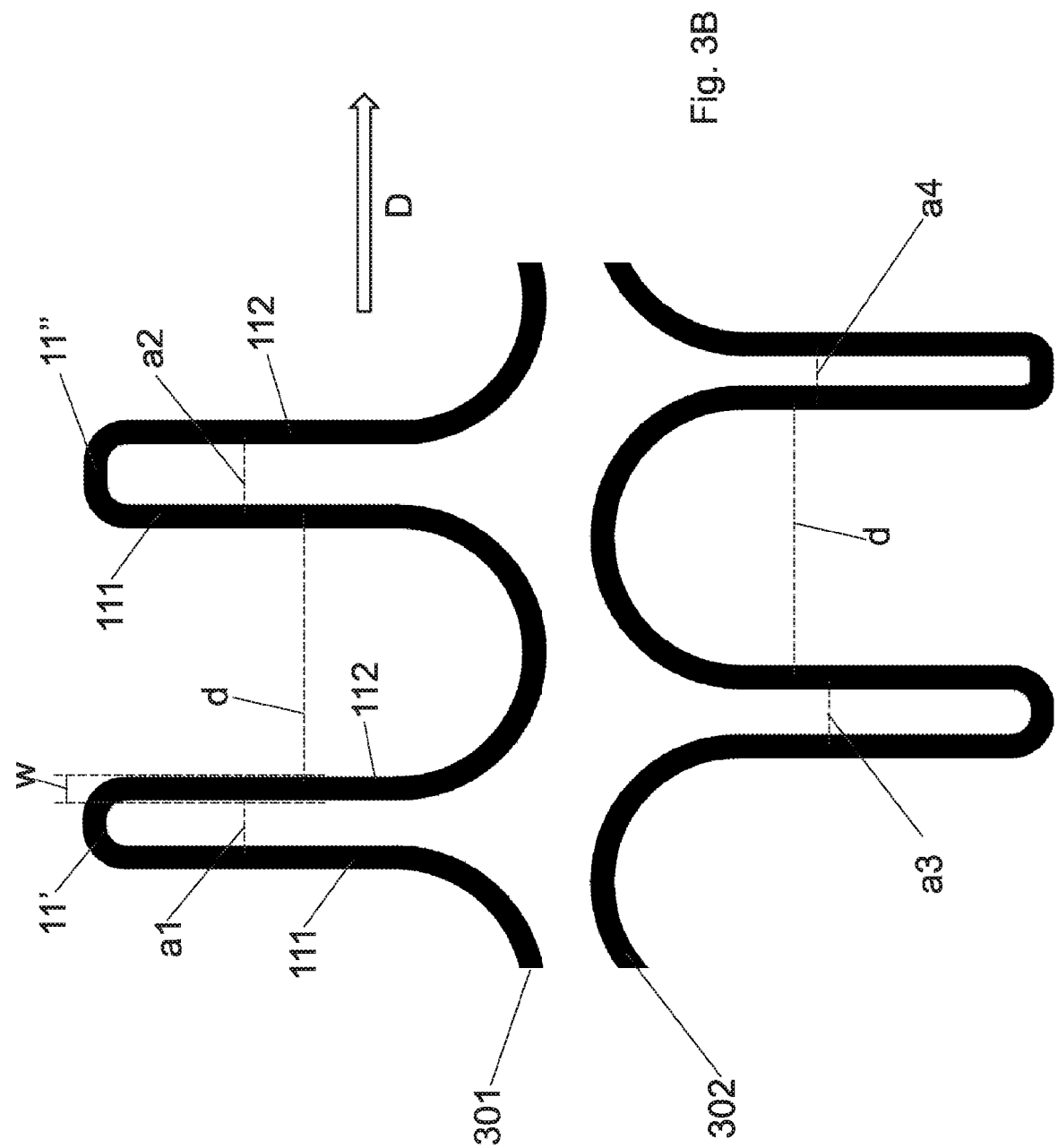

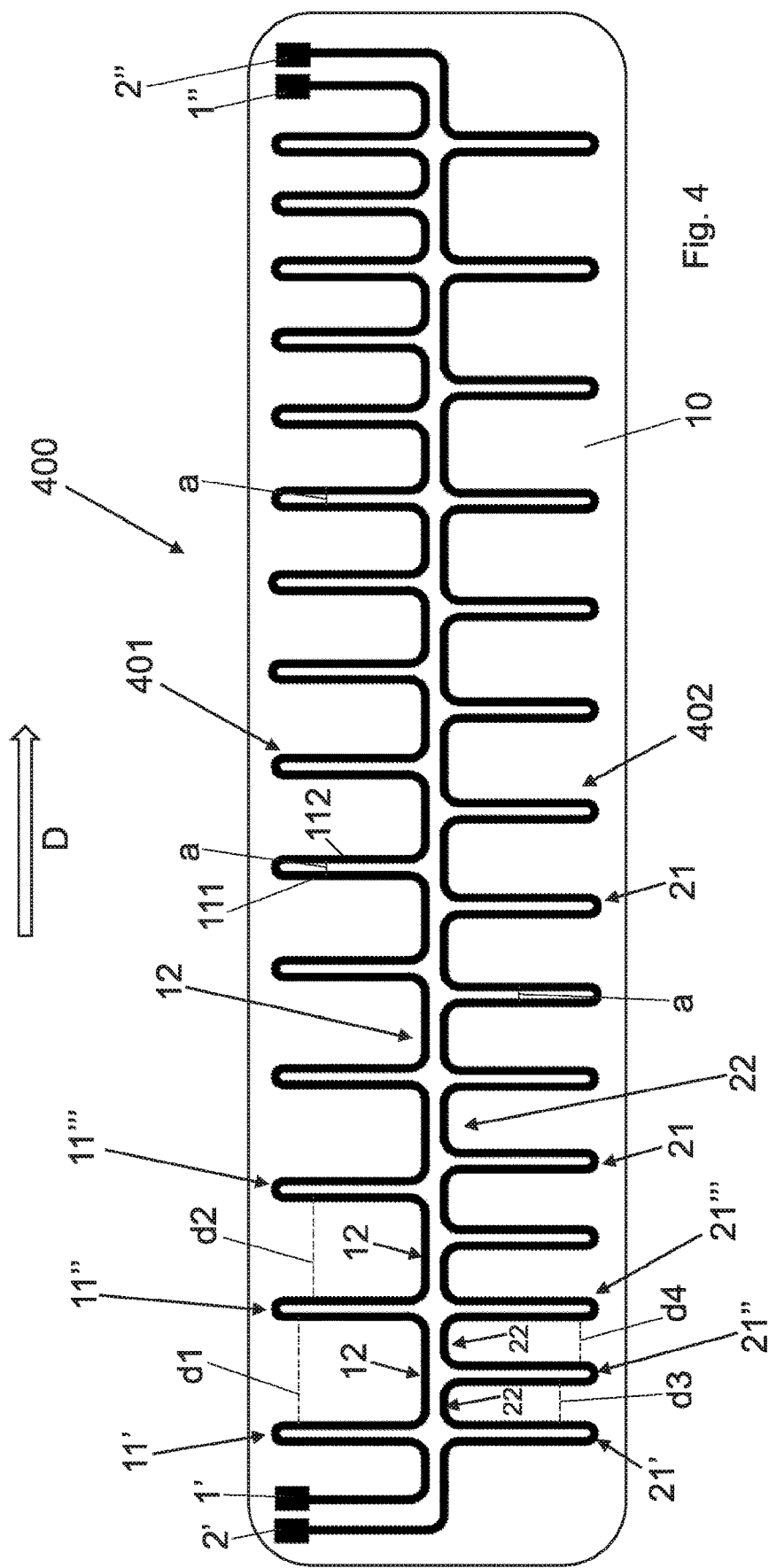

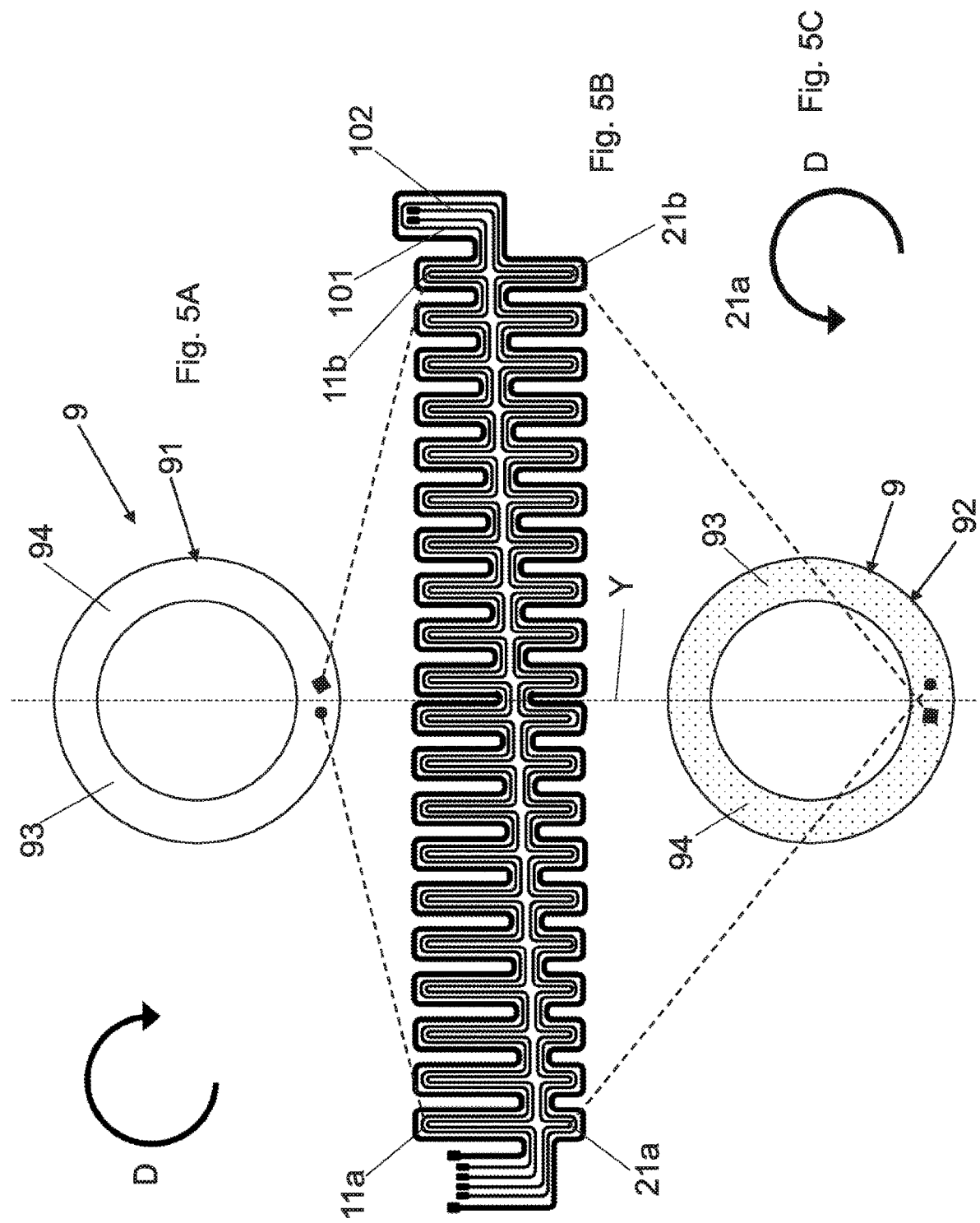

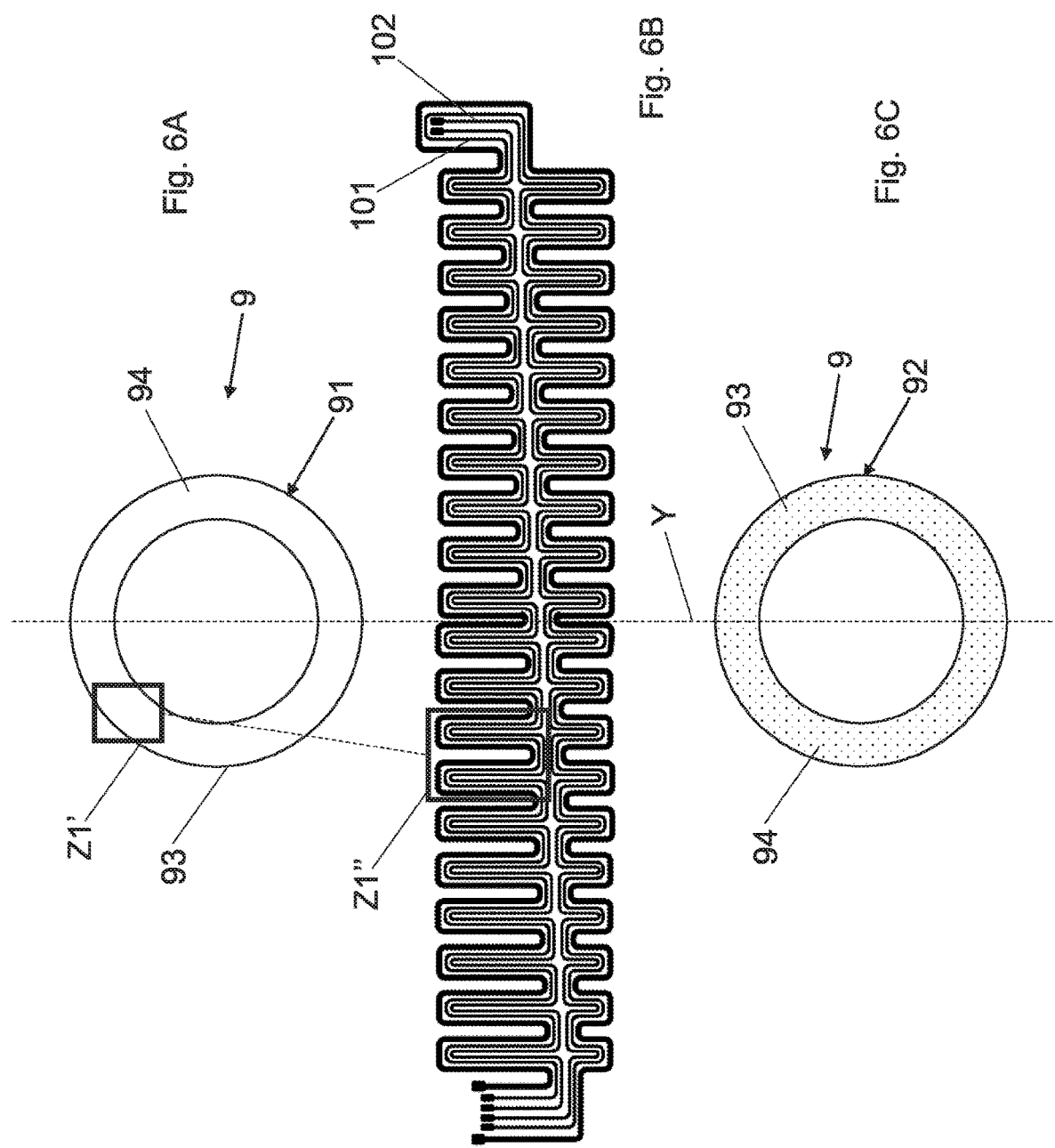

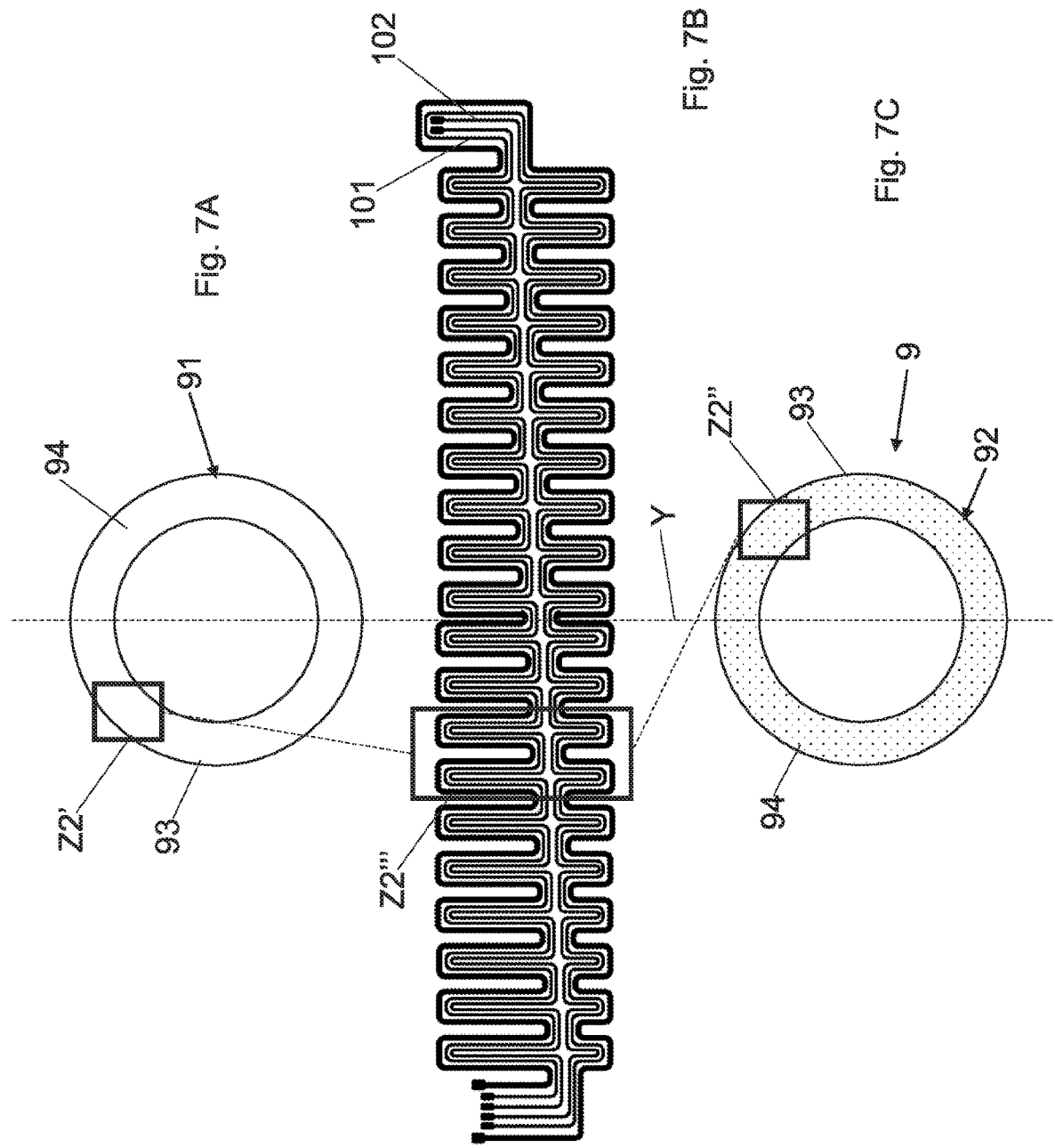

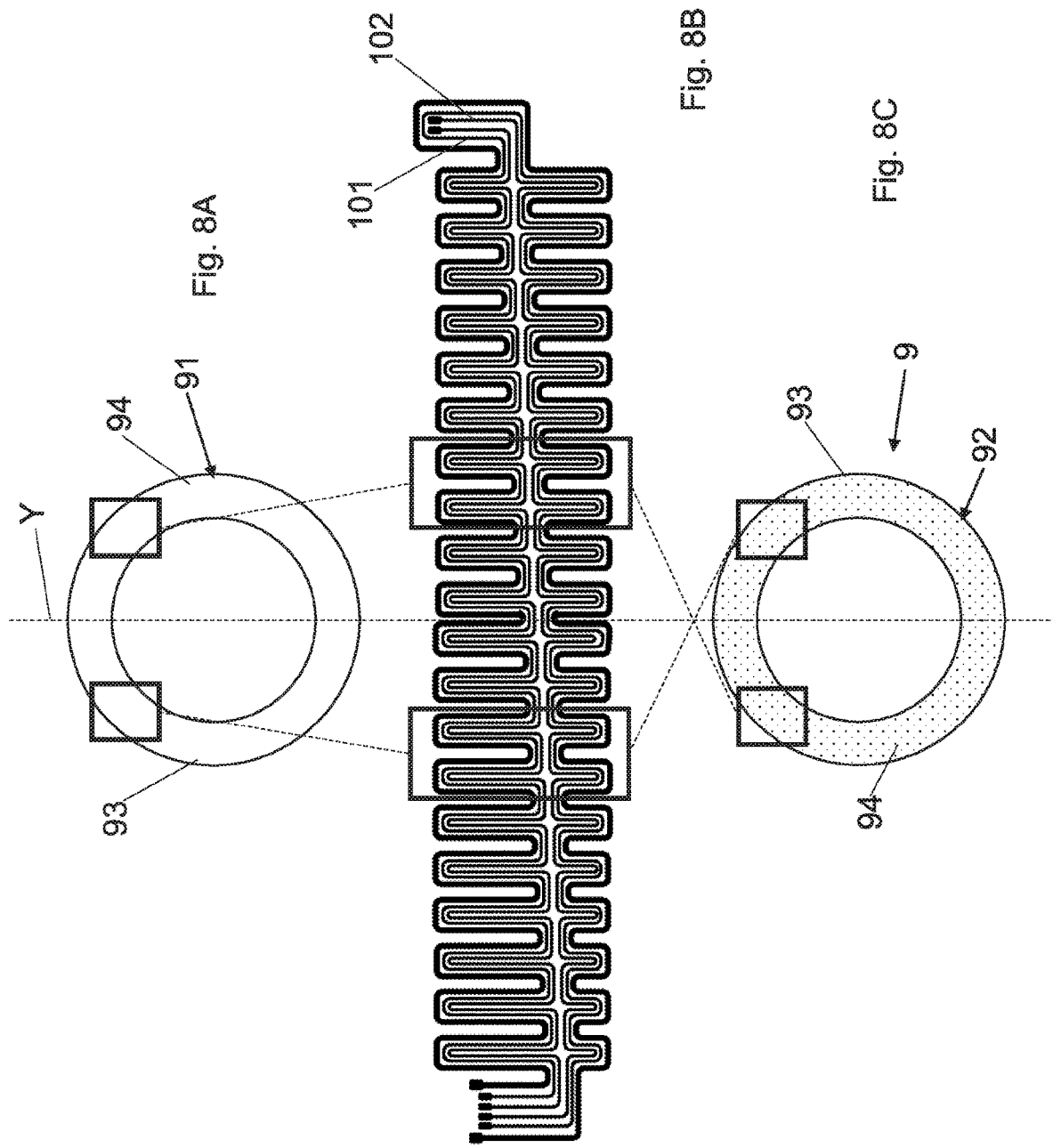

STEERING WHEEL SENSOR

CROSS REFERENCE TO RELATED APPLICATIONS

This application claims benefit under 35 U.S.C. § 371 to international application No. PCT/IB2019/060421 filed on Dec. 4, 2019, which claims priority to Italian application No. 02018000010761 filed Dec. 4, 2018, the contents of which are incorporated by reference in their entireties.

FIELD OF THE INVENTION

The present invention relates to a device or component for detecting the contact between a user's hand or hands and the steering wheel of a vehicle. In particular, the invention relates to a device or component which is applied to the steering wheel.

BACKGROUND ART

The correct grip of the steering wheel is an important aspect of driving safety. Therefore, systems have been recently developed which are capable of determining whether or not the driver has his/her hands on the steering wheel. The detection of contact however is not sufficient to identify the manner in which the driver is gripping the steering wheel.

Indeed, it is important to understand both how the contact occurs and whether the driver is actually gripping the steering wheel with a correct grip.

Successfully obtaining this information is not trivial. In particular, it is not trivial to successfully obtain accurate information on the position and gripping manner of the steering wheel by the driver.

Thus, the need is felt to overcome the limitations of the background art.

SUMMARY OF THE INVENTION

It is an object of the present invention to provide a device which allows the position of a driver's hands on the steering wheel of a vehicle to be determined.

It is another object of the present invention to provide such a device which also allows the gripping manner of the steering wheel to be determined.

The present invention achieves at least one of such objects and others which will become apparent in light of the present description, by means of a device or component for detecting the contact between a user and a steering wheel of a vehicle, the device comprising: an electrically insulating support; a first electrically conductive track fastened to the support and comprising a plurality of first peaks alternated with a plurality of first troughs along a direction; in which the first track is distributed over the support so that the surface of the first track adapted to come into contact with a user's hand decreases along a direction.

It is worth noting that the term "contact" comprises both a direct contact and an indirect contact, for example an indirect contact through one or more layers which are over the track. An indirect contact typically is a capacitive coupling between one or more parts of the driver's body, e.g. the hand, and one or more conductive tracks used as sensor. The covering layer over the track, and over the device in general, is for example, made of leather.

The first track advantageously is adapted to operate as contact sensor, in particular when a user's hand or hands touch or are close to the steering wheel, for example when the driver touches a covering layer of the steering wheel (which may for example, be made of leather) under which the device is provided.

The particular distribution of the first track advantageously allows an electronic control unit to process an electrical quantity, for example a capacitance, associated with the conductive track.

In particular, the electronic control unit may read and possibly process a variation of an electrical quantity induced by the contact of a user's hand with the steering wheel provided with the device according to the invention. In greater detail, the position where the contact between the hand and steering wheel may be determined due to the spatial distribution of the track. For example, it may be determined whether the contact with the hand occurs on the right-hand side or on the left-hand side of the steering wheel. Indeed, the absolute variation value of the electrical quantity varies according to the position where the contact occurs because the absolute value varies according to the surface extension of the part of the track touched, preferably indirectly, by the hand. The highest variation values of the electrical quantity typically occur in the area where the surface of the first track adapted to come into contact with the hand is greatest. The variation values of the electrical quantity are gradually lower moving along direction D.

In a first particular embodiment, the aforesaid distribution of the first track over the support so that the surface of the first track adapted to come into contact with a user's hand decreases along a direction D, is obtained by means of a track wherein the height h1, h2 of the peaks decreases along said direction D.

In a second particular embodiment, the aforesaid distribution of the track over the support so that the surface of the first track adapted to come into contact with a user's hand decreases along a direction D, is obtained by means of a track wherein the width w1, w2 of the first track decreases along said direction D.

In a third particular embodiment, the aforesaid distribution of the track over the support so that the surface of the track adapted to come into contact with a user's hand decreases along a direction D, is obtained by means of a track wherein the width a1, a2 of the peaks increases along said direction D.

In a fourth particular embodiment, the aforesaid distribution of the track over the support so that the surface of the track adapted to come into contact with a user's hand decreases along a direction D, is obtained by means of a track wherein the gap d1, d2 between the peaks 11 increases along said direction D.

According to an advantageous aspect, the device may also comprise a second conductive track, different from the first track, which serves as contact sensor.

The second track advantageously is distributed over the support so that the surface of the second track adapted to come into contact with a user's hand increases along the aforesaid direction, in opposite direction with respect to the first track.

Thus, while the surface of the first track adapted to come into contact with a user's hand decreases along direction D, and more specifically in the same direction as direction D, the surface of the second track adapted to come into contact with a user's hand increases.

Thereby, whether or not the user's whole hand grips the steering wheel, i.e. when his/her hand touches, preferably indirectly, both tracks, may advantageously be discriminated. Such a gripping condition may be identified for example, according to logical relations, for example when an "AND" occurs between the conditions in which, for each of the two conductive tracks, the absolute values of the variation of an electrical quantity, e.g. the capacitance, induced by the contact between the hand and the two conductive tracks, are greater than a preset threshold level.

Therefore, when there is also the second track, the device allows both the position where the contact occurs and the contact manner to be determined.

Moreover, the device also allows whether or not the user is correctly gripping the steering wheel with both hands, to be detected.

Optionally, the device also comprises a third conductive track, which serves as heating track for heating the steering wheel.

Moreover, the device optionally also comprises a fourth conductive track, which advantageously is used as shielding track to avoid interferences, in particular capacitive couplings or electromagnetic interferences in general, between the first track (sensor track) and the third track (heating track) and when provided, between the second track and the third track.

The shielding effect is obtained by means of the particular arrangement of the shielding track, i.e. between the first track and the third track and when provided, between the second track and the third track.

Thereby, it can be ensured that the first track and the second track (when provided) are put, by means of the electronic control unit, at the same potential as the shielding track so as to avoid the detection of false touches due for example, to a water drop on the steering wheel.

The first track and the second track are preferably arranged on the same surface or layer. All the conductive tracks with which the device is provided are preferably arranged on the same surface or layer.

According to one aspect, the invention also comprises a steering wheel of a vehicle provided with at least one device according to any one of claims 1 to 12.

Further features and advantages of the invention will be more apparent in light of the detailed description of certain non-limiting embodiments.

The dependent claims describe particular embodiments of the invention.

BRIEF DESCRIPTION OF THE DRAWINGS

Reference is made in the description of the invention to accompanying drawings, which are provided by way of a non-limiting example, in which:

FIG. 1A shows a top plan view of a device according to a first embodiment of the invention;

FIG. 1B shows an enlarged detail of FIG. 1A;

FIG. 1D shows an enlarged detail of FIG. 1C;

FIG. 1E shows another enlarged detail of FIG. 1C;

FIG. 2A shows a top plan view of a first variant of a device according to a second embodiment of the invention;

FIG. 2B shows an enlarged detail of FIG. 2A;

FIG. 2C shows an enlarged detail of part of two components of the device in FIG. 2A;

FIG. 3B shows a top plan view of part of two components of a device according to the third embodiment of the invention;

FIG. 4 shows a top plan view of a device according to a fourth embodiment of the invention;

FIG. 5A diagrammatically shows a front frontal view of a steering wheel according to the invention.

FIG. 5B shows a top plan view of part of the device according to a first embodiment;

FIG. 5C diagrammatically shows a rear frontal view of the steering wheel in FIG. 5A;

FIGS. 6A, 7A and 8A each show a view as in FIG. 5A, where the contact area or areas are diagrammatically shown;

FIGS. 6B, 7B and 8B each show a view as in FIG. 5B, where the contact area or areas are diagrammatically shown;

FIGS. 6C, 7C and 8C each show a view as in FIG. 5C, where the contact area or areas are diagrammatically shown.

DETAILED DESCRIPTION OF EXAMPLE EMBODIMENTS OF THE INVENTION

Figure 1C:
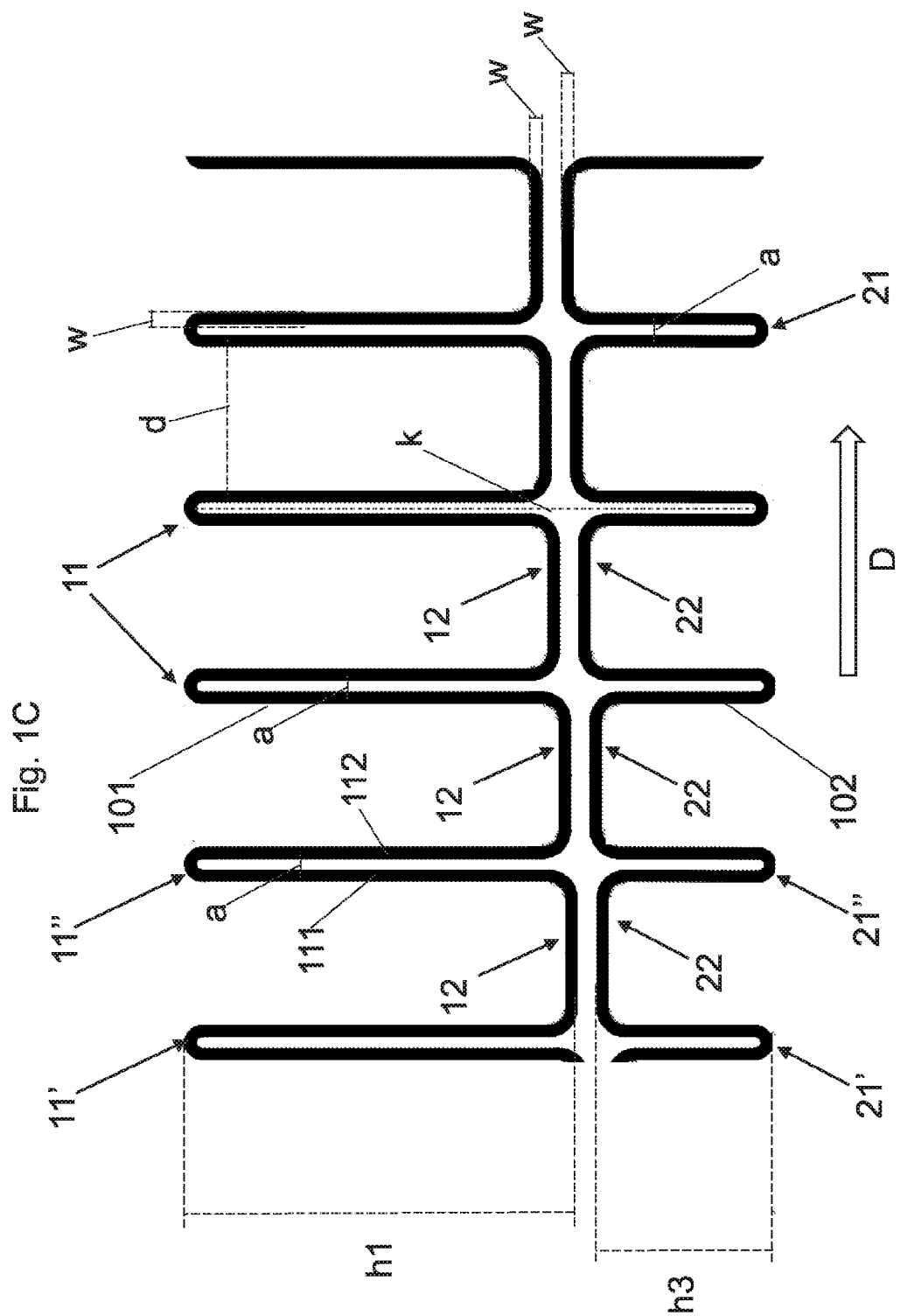
FIG. 1C shows an enlarged detail of part of two components of the device in FIG. 1A.
Figure 2D:
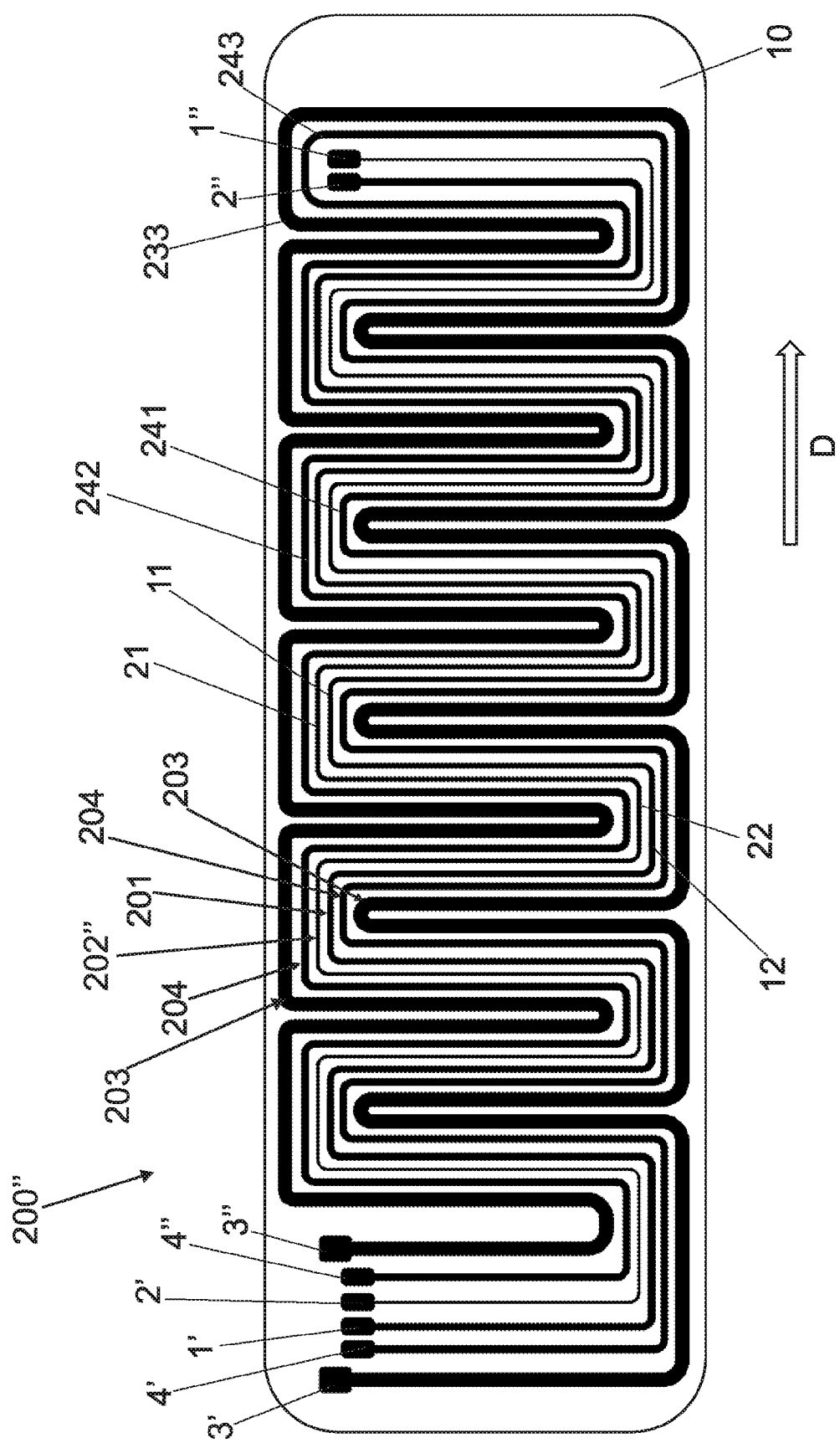
FIG. 2D shows a top plan view of a second variant of a device according to the second embodiment of the invention.

With reference to the figures, embodiments are described of a device 100, 200', 200", 300, 400, or component, for detecting the contact between a user's hand or hands and a steering wheel of a vehicle.

In all the embodiments, the device 100, 200', 200", 300, 400 comprises an electrically insulating support 10 and an electrically conductive track 101, 201, 301, 401 (also called "first track") which is fastened to the support 10.

Track 101, 201, 301, 401 is adapted to act as contact sensor.

Track 101, 201, 301, 401 comprises, i.e. is shaped so as to comprise, a plurality of peaks 11 (or crests) alternated with a plurality of troughs 12 (or valleys) along a direction D. In other words, the peaks 11 and the troughs 12 alternate with one another, whereby there is a trough 12 after a peak 11 and there is a peak 11 after a trough 12.

Track 101, 201, 301, 401 advantageously is distributed over the support so that the surface of the track adapted to come into contact with a user's hand decreases along direction D, for example in the direction indicated by arrow D in the drawings, as for device 100, 200', 200", 300, or in the direction opposite to the direction indicated by arrow D, as for device 400. Preferably, direction D is parallel to the longitudinal axis of device 100, 200', 200", 300, 400. When the device is supported on a support plane, the longitudinal axis of the device is a rectilinear axis.

Preferably, such a decrease of the surface adapted to come into contact with a user's hand is a gradual decrease.

In particular, it is worth noting in FIGS. 1A to 4, that device 100, 200', 200", 300, 400 and the components thereof are illustrated in a condition in which device 100, 200', 200", 300, 400 is supported on a support plane.

As is described below, device 100, 200', 200", 300, 400 is flexible, whereby it may also take on other shapes, in particular when device 100, 200', 200", 300, 400 is arranged on the steering wheel 9 of a vehicle, for example around the steering wheel 9.

It is also worth noting that support 10 is shown by mere way of example, it being understood that it may also have other shapes which are not shown, in particular according to the steering wheel 9 on which the device is intended to be arranged.

With particular reference to FIGS. 1A to 1E, in a first embodiment, the aforesaid distribution of track 101 over support 10 so that the surface of track 101 adapted to come into contact with a user's hand decreases, preferably gradually, along the direction D, is obtained by means of a track 101 in which the height h1, h2 (FIGS. 1C and 1D) of the peaks 11 decreases along said direction D, for example in the direction indicated by arrow D.

As already mentioned, track 101 is adapted to act as contact sensor. For this purpose, track 101 comprises two end portions. Each end portion comprises an end 1', 1" (FIG. 1A) which serves as pad for the connection to an electronic control unit (not shown).

The aforesaid peaks 11 and the aforesaid troughs 12 extend between the ends 1', 1", in particular between the aforesaid end portions.

Height h1 of a peak 11' is greater than height h2 of the next peak 11" along direction D, in the direction indicated by arrow D (FIG. 1D).

Preferably, the height of any peak 11 along direction D is always higher than the height of the next peak 11.

The height of the peaks 11 preferably decreases gradually one peak after the other. Preferably, the difference in height between any peak 11 and the next peak 11 is a constant, or substantially constant, value.

Preferably, the difference in height between any peak 11 and the next peak 11 is in a range between 0.1 and 1 mm.

Preferably, the height of peak 11 proximal to the end 1' (on the far left in FIG. 1A) is in a range between 70 and 100 mm. Preferably, the peak 11 proximal to the end 1' is the peak having the maximum height with respect to the other peaks 11.

Preferably, the height of the peak 11 distal from the end 1' (to the far right in FIG. 1A) is in a range between 5 and 20 mm. Preferably, the peak 11 distal from the end 1' is the peak having the minimum height with respect to the other peaks 11.

The heights h1, h2 of the peaks 11 preferably correspond to the minimum distance between a straight line r1 tangent to the top of a peak 11 and a straight line r2, r3 tangent to the bottom of the trough 12 next to said peak 11—with respect to the direction D—which in particular is next and adjacent to said peak 11.

In FIG. 1D for example, the height h1 of peak 11' is equal to the minimum distance between the straight line r1, which is tangent to the top of peak 11', and the straight line r2, which is tangent to the bottom of trough 12'. Similarly, the height h2 of peak 11" is equal to the minimum distance between the straight line r1, which is tangent to the top of the peak 11", and the straight line r3, which is tangent to the bottom of the trough 12".

Preferably, the straight lines r1, r2, r3 are parallel to one another.

Preferably, the straight line r1 is tangent to the top of all the peaks 11, while the straight lines r2 and r3, as the other straight lines which are tangent to the bottom of the other troughs 12, are separate from and parallel to one another.

Preferably, the heights of the peaks 11 are mutually parallel segments.

Preferably, the heights of the peaks 11 are segments perpendicular to direction D.

Preferably, the tops of the peaks 11 are curved stretches.

Preferably, the width "w" (FIG. 1C) of track 101 is constant or substantially constant.

Alternatively, the width of the first track decreases along said direction D, in the same direction in which the height of the peaks 11 decreases.

Preferably, the width "w" of track 101 is between 0.5 and 2 mm.

Preferably, the gap "d" between the peaks 11 is constant, or substantially constant, along direction D. "Gap" means the minimum distance, parallel to direction D, between two consecutive peaks 11. Gap "d" between the peaks 11 preferably is between 10 and 18 mm.

All peaks 11 preferably have the same width "a". "Width of a peak" means the minimum distance "a", in particular parallel to direction D, between two opposite stretches 111, 112 of the same peak 11. Preferably, but not exclusively, such stretches 111, 112 are parallel to each other, and preferably also are perpendicular to direction D, as in the example shown. Typically, but not exclusively, the stretches 111, 112 are joined to each other by the top of the peak.

Preferably, the overall length of track 101 is between 4000 and 6000 mm, such a length being measured along the whole path of track 101.

Device 100 preferably also comprises a second electrically conductive track 102 fastened to support 10. The second track 102 is distinct from the first track 101.

The second track 102 is adapted to act as contact sensor. For this purpose, the second track 102 comprises two end portions. Each end portion comprises an end 2', 2" (FIG. 1A) which acts as pad for the connection to the electronic control unit.

Track 101 and track 102 preferably are the only tracks adapted to act as contact sensors.

The second track 102 comprises a plurality of peaks 21 alternated by a plurality of troughs 22 along the aforesaid direction D, between the ends 2', 2", in particular between the aforesaid end portions. In other words, the peaks 21 and the troughs 22 alternate with one another, whereby there is a trough 22 after a peak 21 and there is a peak 21 after a trough 22.

The number of peaks 11 of the first track 101 preferably is equal to the number of peaks 21 of the second track 102. Therefore, the number of troughs 12 of the first track 101 is equal to the number of troughs 22 of the second track 102.

The second track 102 is distributed over support 10 so that the surface of the second track 102 adapted to come into contact with a user's hand increases, preferably gradually increases, along the aforesaid direction D, in particular in the direction indicated by arrow D.

In particular, the height h3 of a peak 21' is less than the height h4 of the next peak 21" (FIG. 1E) along direction D.

The height of any peak 21 along direction D preferably is always less than the height of the next peak 21.

The height of the peaks 21 preferably gradually increases one peak after the other.

The difference in height between any peak 21 and the next peak 21 preferably is a constant, or substantially constant, value.

The difference in height between one peak 21 and the next peak 21 preferably is in a range between 0.1 and 1 mm.

The height of the peak 21 proximal to the end 2' (on the far left in FIG. 1A) preferably is in a range between 5 and 20 mm. The peak 21 proximal to the end 2' preferably is the peak having the minimum height with respect to the other peaks 21.

The height of the peak 21 distal from the end 2' (to the far right in FIG. 1A) preferably is in a range between 70 and 100 mm. The peak 21 distal from the end 2' preferably is the peak having the maximum height with respect to the other peaks 21.

The heights h3, h4 of the peaks 21 preferably correspond to the minimum distance between a straight line r4 tangent to the bottom of a peak 21 and a straight line r5, r6 tangent to the top of trough 22 next to said peak 21—with respect to the direction D—which in particular is next and adjacent to said peak 21.

In FIG. 1E for example, the height h3 of peak 21' is equal to the minimum distance between the straight line r4, which is tangent to the bottom of peak 21', and the straight line r5, which is tangent to the top of trough 22'. Similarly, the height h4 of peak 21" is equal to the minimum distance between the straight line r4, which is tangent to the bottom of peak 21", and the straight line r6, which is tangent to the top of trough 22".

The straight lines r4, r5, r6 preferably are parallel to one another.

The straight line r4 preferably is tangent to the bottom of all the peaks 21, while the straight lines r4 and r5, as the other straight lines which are tangent to the top of the other troughs 22, are distinct from and parallel to one another.

The heights of the peaks 21 preferably are mutually parallel segments.

The heights of the peaks 21 preferably are segments which are perpendicular to direction D.

The bottoms of the peaks 21 preferably are curved stretches.

Width "w" of track 102 preferably is constant or substantially constant.

Alternatively, the width of the second track increases along said direction D, in the same direction in which the height of the peaks 21 increases.

Width "w" of track 102 preferably is between 0.5 and 2 mm.

Width "w" of the second track 102 preferably is equal to the width of the first track 101.

Gap "d" between the peaks 21 preferably is constant, or substantially constant, along direction D. The gap between the peaks 21 preferably is between 10 and 18 mm.

The gap between the peaks 21 preferably is equal to the gap between the peaks 11.

The peaks 21 preferably all have the same width "a", which preferably is equal to the width of the peaks 11 of the first track 101.

Each peak 11 of the first track 101 preferably is aligned with a respective peak 21 of the second track 102, in particular aligned along an axis which is orthogonal to direction D.

As in the example shown in FIG. 1A, the peaks 11 of the first track 101 and the peaks 21 of the second track 102 preferably extend in mutually opposite direction, in particular in height, preferably along respective directions which are transverse, preferably perpendicular, to direction D.

The bottoms of the peaks 21 preferably are curved stretches.

The top of each peak 11 of the first track 101 preferably is concave towards the concavity of the bottom of a respective peak 21 aligned therewith of the second track 102.

The first track 101 and the second track 102 preferably are shaped so that the minimum distance "k" (FIG. 1C), which is perpendicular to direction D, between the top of a peak 11 and the bottom of peak 21 aligned with said peak 21, is equal for all the pairs of peaks 11-21.

The overall length of the second track 102 preferably is between 4000 and 6000 mm, such a length being measured along the whole path of track 102.

The overall length of the second track 102 preferably is equal to, or about equal to, the overall length of the first track 101.

Device 100 optionally also comprises a third electrically conductive track 103 (FIG. 1A-1B) fastened to support 10.

The third track 103 is adapted to act as heating track.

The third track 103 comprises a first stretch 131 which extends parallel, or substantially parallel, to the first track 101.

In particular, the first stretch 131 of the third track 103 comprises a plurality of peaks and troughs which extend parallel, or substantially parallel, to the peaks 11 and troughs 12 of the first track 101.

Also the height of the peaks of the first stretch 131 of the third track 103 preferably decreases along direction D, in the same direction in which the height of the peaks 11 of the first track 101 decreases.

The number of peaks and troughs of the first stretch 131 preferably is equal to the number of peaks 11 and troughs 12 of the first track 101.

When the second track 102 is also provided, the third track 103 preferably also comprises a second stretch 132 which extends parallel, or substantially parallel, to the second track 102.

In particular, the second stretch 132 of the third track 103 comprises a plurality of peaks and troughs which extend parallel, or substantially parallel, to the peaks 21 and troughs 22 of the second track 102.

Also the height of the peaks of the second stretch 132 of the third track 103 preferably increases along direction D, in the same direction in which the height of the peaks 21 of the second track 102 increases.

The number of peaks and troughs of the second stretch 132 preferably is equal to the number of peaks 21 and troughs 22 of the second track 102.

The first stretch 131 and the second stretch 132 of the third track 103 are joined to each other by a union stretch 133.

The third track 103 comprises two end portions, preferably only two end portions, each provided with two ends 3', 3" which act as pads for the connection to the electronic control unit.

The width of the third track 103 preferably is greater than width "w" of the first track 101 and with respect to width "w" of the second track 102.

The width of the third track 103 preferably is constant or substantially constant.

The width of the third track 103 preferably is between 0.5 and 4 mm.

The distance, the minimum distance in particular, between the first stretch 131 of the third track 103 and the first track 101 preferably is between 2.5 and 4 mm, such a distance preferably being constant or substantially constant.

The distance, the minimum distance in particular, between the second stretch 132 of the third track 103 and the second track 102 preferably is between 2.5 and 4 mm, such a distance preferably being constant or substantially constant.

The third track 103 preferably is proximal to the periphery, or outline, of device 100, in particular to the periphery of support 10, and the first track 101 and the second track 102 (when provided) are distal with respect to the periphery of device 100, in particular to the periphery of support 10. Alternatively in a variant not shown, the first track and the second track (when provided) optionally are proximal to the periphery of the device, in particular to the periphery of the insulating support, and the third track is distal from the periphery, or outline, of the device, in particular with respect to the periphery of the insulating support.

Device 100 preferably also comprises a fourth electrically conductive track 104 fastened to support 10.

The fourth track 104 serves as shielding track to avoid interferences, in particular capacitive couplings or electromagnetic interferences in general, between the first track 101 and the third track 103 and when provided, between the second track 102 and the third track 103.

The fourth track 104 comprises a first stretch 141 which extends between the first track 101 and the third track 103.

The first stretch 141 of the fourth track 104 preferably extends parallel, or substantially parallel, to the first track 101 and to the third track 103.

In particular, the first stretch 141 of the fourth track 104 comprises a plurality of peaks and troughs which extend parallel, or substantially parallel, to the peaks 11 and troughs 12 of the first track 101.

Also the height of the peaks of the first stretch 141 of the fourth track 104 preferably decreases along direction D, in the same direction in which the height of the peaks 11 of the first track 101 decreases.

The number of peaks and troughs of the first stretch 141 preferably is equal to the number of peaks 11 and troughs 12 of the first track 101.

When the second track 102 is also provided, the fourth track 104 preferably also comprises a second stretch 142 which extends between the second track 102 and the third track 103.

The second stretch 142 of the fourth track 104 preferably extends parallel, or substantially parallel, to the second track 102.

In particular, the second stretch 142 of the fourth track 104 comprises a plurality of peaks and troughs which extend parallel, or substantially parallel, to the peaks 21 and troughs 22 of the second track 102.

Also the height of the peaks of the second stretch 142 of the fourth track 104 preferably increases along direction D, in the same direction in which the height of the peaks 21 of the second track 102 increases.

The number of peaks and troughs of the second stretch 142 preferably is equal to the number of peaks 11 and troughs 12 of the second track 102.

The first stretch 141 and the second stretch 142 of the fourth track 104 are joined to each other by a union stretch 143.

The fourth track 104 comprises two end portions, preferably only two end portions, each provided with two ends 4', 4" which act as pads for the connection to the electronic control unit.

The width of the fourth track 104 preferably is constant or substantially constant.

The width of the fourth track 104 preferably is between 0.5 and 2 mm.

The width of the fourth track 104 preferably is equal to, or about equal to, the width of the first track 101.

The first stretch 141 of the fourth track 104 preferably is equally spaced from, or about equally spaced from, the first track 101 and from the third track 103, and the second stretch 142 of the fourth track 104 is equally spaced from, or about equally spaced from, the second track 102 and from the third track 103.

With particular reference to FIGS. 2A to 2D, in a second embodiment of a device 200', 200", the aforesaid distribution of the track over the support so that the surface of the track adapted to come into contact with a user's hand decreases along direction D, is obtained by means of a track 201 in which width w1, w2 (FIG. 2C) of the first track 201 decreases along said direction D, for example in the direction indicated by arrow D.

In all the embodiments, width of the track means the measurement taken parallel to the surface of support 10 and perpendicular to the axis of the track. Thickness of the track instead means the measurement taken perpendicular to the surface of support 10 and to the axis of the track.

As already mentioned, track 201 is adapted to act as contact sensor. For this purpose, track 201 comprises two end portions. Each end portion comprises an end 1', 1" (FIG. 2A) which acts as pad for the connection to the electronic control unit (not shown).

The aforesaid peaks 11 and the aforesaid troughs 12 extend between the ends 1', 1", in particular between the aforesaid end portions.

In greater detail, the aforesaid reduction in width of track 201 is along the path of track 201, i.e. along the actual length of track 201.

The reduction in width of track 201 preferably is gradual.

By mere way of example, the reduction in width may occur stretch after stretch, i.e. any one stretch always has a greater constant width than the constant width of the next stretch, in particular in the direction of direction D indicated by the arrow.

The width of the track preferably, but not exclusively, decreases by 1% to 2.5% for each stretch.

The width of track 201 preferably decreases by a constant value.

By mere way of example, each stretch having constant, or substantially constant, width may be formed by a peak 11 and the next trough 12, in particular by the start of a rectilinear stretch 111 of a peak 11 up to the start of the rectilinear stretch 111 of the next peak 11.

For example, with particular reference to FIG. 2C, the width of a first stretch of track 201 formed by a first peak 11'-trough 12' pair has a width "w1"; and the width of a second stretch of track 201, adjacent and next to the first stretch, formed by a second peak 11"-trough 12" pair has a width "w2" (trough 12" is partially shown in FIG. 2C). Width w2 is from 1% to 2.5% smaller with respect to width w1, for example about 1% smaller.

Alternatively, by mere way of example, the reduction in width may also occur between stretch 111 and stretch 112 of the same peak. In particular, stretch 112 may have a smaller width with respect to stretch 111 of the same peak, and a greater width with respect to stretch 111 of the next peak, and so on.

The peaks 11 preferably have the same width "a". "Width of a peak" means the minimum distance "a", in particular parallel to direction D, between two opposite stretches 111, 112 of the same peak 11. Preferably, but not exclusively, such stretches 111, 112 are parallel to each other, and preferably also are perpendicular to direction D, as in the example shown. Typically, but not exclusively, the stretches 111, 112 are joined to each other by the top of the peak.

The height of the peaks 11 preferably is constant, or substantially constant, i.e. it is preferable for all the peaks 11 to have the same height. Alternatively, the height of the peaks 11 may decrease, substantially as described for the first embodiment, in the same direction in which the width of track 201 decreases.

The height of the peaks 11 preferably is between 30 and 60 mm.

The overall length of track 201 preferably is between 4000 and 6000 mm, such a length being measured along the whole path of track 201.

Gap "d" between the peaks 11 preferably is constant, or substantially constant, along direction D. In other words, the gap between any pair of consecutive peaks 11 is a constant, or substantially constant, value. "Gap" means the minimum distance, parallel to direction D, between two consecutive peaks 11. The gap between the peaks 11 preferably is between 10 and 18 mm.

Device 200', 200" preferably also comprises a second electrically conductive track 202', 202" fastened to support 10. The second track 202', 202" is distinct from the first track 201.

The second track 202', 202" is adapted to act as contact sensor. For this purpose, the second track 202', 202" comprises two end portions. Each end portion comprises an end 2', 2" which acts as pad for the connection to the electronic control unit.

Track 201 and track 202', 202" preferably are the only tracks adapted to act as contact sensors.

The second track 202', 202" comprises a plurality of peaks 21 alternated by a plurality of troughs 22 along the aforesaid direction D, between the ends 2', 2", in particular between the aforesaid end portions. In other words, the peaks 21 and the troughs 22 alternate with one another, whereby there is a trough 22 after a peak 21 and there is a peak 21 after a trough 22.

The number of peaks 11 of the first track 201 preferably is equal to the number of peaks 21 of the second track 202', 202", Therefore, the number of troughs 12 of the first track 201 is equal to the number of troughs 22 of the second track 202', 202".

The second track 202', 202" is distributed over support 10 so that the surface of the second track 202', 202" adapted to come into contact with a user's hand increases along the aforesaid direction D.

In particular, the width w3, w4 of the second track 202', 202" increases along said direction D, in the direction indicated by the arrow.

In greater detail, the aforesaid increase in width of track 202', 202" is along the path of track 202, i.e. along the actual length of track 202.

The increase in width of track 202', 202" preferably is gradual.

By mere way of example, the increase in width may occur stretch after stretch, i.e. any one stretch always has a smaller constant width than the constant width of the next stretch, in the direction of direction D indicated by the arrow.

The width of the track 202', 202" preferably, but not exclusively, increases by 1% to 2.5% for each stretch.

The width of track 202', 202" preferably increases by a constant value.

By mere way of example, each stretch having constant, or substantially constant, width may be formed by a peak 21' and the next trough 22'.

For example, the width of a first stretch of track 202', 202" formed by a first peak 21'-trough 22' pair has a width "w3"; and the width of a second stretch of track 202', 202", consecutive to the first stretch, formed by a second peak 21"-trough 22" pair has a width "w4" (trough 22" is partially shown in FIG. 1C). Width w4 is from 1% to 2.5% greater with respect to width w3, for example about 1% greater.

Alternatively, by mere way of example, the increase in width may also occur between stretch 111 and stretch 112 of the same peak. In particular, the stretch 112 may have a greater width with respect to stretch 111 of the same peak, and a smaller width with respect to stretch 111 of the next peak, and so on.

The manner in which the increase in width of track 202', 202" occurs preferably is similar to the manner in which the decrease in width of track 201 occurs.

The overall length of the second track 202', 202" preferably is between 4000 and 6000 mm, such a length being measured along the whole path of track 202', 202".

The overall length of the second track 202', 202" preferably is equal to, or about equal to, the overall length of the first track 201.

The peaks 21 preferably have the same width "a", which preferably is equal to the width of the peaks 11 of the first track 201.

The height of the peaks 21 preferably is constant, or substantially constant, i.e. it is preferable for all the peaks 11 to have the same height. Alternatively, the width of the peaks 21 may increase in the same direction in which the width of the second track increases.

The height of the peaks 21 of the second track 202', 202" preferably is equal to, or about equal to, the height of the peaks 11 of the first track 201.

The height of the peaks 21 preferably is between 30 and 60 mm.

The gap between any pair of consecutive peaks 21 preferably is a constant, or substantially constant, value.

The gap between the peaks 21 preferably has an extension between 10 and 18 mm.

The gap between the peaks 21 preferably is equal to gap d between the peaks 11.

Each peak 11 of the first track 201 preferably is aligned with a respective peak 21 of the second track 202', 202", in particular aligned along an axis which is perpendicular to direction D.

In a first variant of the second embodiment (FIGS. 2A-2B-2C), the peaks 11 of the first track 101 and the peaks 21 of the second track 202' extend in mutually opposite direction, in particular in height, preferably along respective directions which are transverse, preferably perpendicular, to direction D.

In the first variant, the first track 201 and the second track 202' preferably are shaped so that the minimum distance "k" (FIG. 1C), which is perpendicular to direction D, between the top of a peak 11 and the bottom of peak 21 aligned with said peak 11, is equal for all the pairs of peaks 11-21.

In a second variant of the second embodiment (FIG. 2D), the peaks 11 of the first track 201 and the peaks 21 of the second track 202" extend in the same direction. The second track 202" preferably extends parallel, or substantially parallel, to the first track 201.

In both variants, device 200', 200" optionally also comprises a third electrically conductive track 203 fastened to support 10.

The third track 203 is adapted to act as heating track.

The third track 203 comprises a first stretch 231 which extends parallel, or substantially parallel, to the first track 201.

In particular, the first stretch 231 of the third track 203 comprises a plurality of peaks and troughs which extend parallel, or substantially parallel, to the peaks 11 and troughs 12 of the first track 201.

The number of peaks and troughs of the first stretch 231 preferably is equal to the number of peaks 11 and troughs 12 of the first track 201.

When the second track 202', 202" is provided, the third track 203 in both variants comprises a second stretch 232 which extends parallel, or substantially parallel, to the second track 202', 202".

In particular, the second stretch 232 of the third track 203 comprises a plurality of peaks and troughs which extend parallel, or substantially parallel, to the peaks 21 and troughs 22 of the second track 202', 202".

The number of peaks and troughs of the second stretch 232 preferably is equal to the number of peaks 21 and troughs 22 of the second track 202', 202".

The first stretch 231 and the second stretch 232 of the third track 203 are joined to each other by a union stretch 233.

The third track 203 comprises two end portions, preferably only two end portions, each provided with two ends 3', 3" which act as pads for the connection to the electronic control unit.

The width of the third track 203 preferably is greater than the maximum width of the first track 201 and with respect to the maximum width of the second track 202', 202".

The width of the third track 203 preferably is constant or substantially constant.

The width of the third track 203 preferably is between 0.5 and 4 mm.

The distance, the minimum distance in particular, between the first stretch 231 of the third track 203 and the first track 201 preferably is between 0.7 and 3 mm, such a distance preferably being constant or substantially constant.

The distance, the minimum distance in particular, between the second stretch 232 of the third track 203 and the second track 202', 202" preferably is between 0.7 and 3 mm, such a distance preferably being constant or substantially constant.

The third track 203 preferably is proximal to the periphery, or outline, of device 200', 200", in particular to the periphery of support 10, and the first track 201 and the second track 202', 202" (when provided) are distal with respect to the periphery of device 200', 200", in particular to the periphery of support 10. Alternatively in a variant not shown, the first track and the second track (when provided) optionally are proximal to the periphery of the device, in particular to the periphery of the insulating support, and the third track is distal from the periphery, or outline, of the device, in particular with respect to the periphery of the insulating support.

Device 200', 200" preferably also comprises a fourth electrically conductive track 204 fastened to support 10.

The fourth track 204 serves as shielding track to avoid interferences, in particular capacitive couplings or electromagnetic interferences in general, between the first track 201 and the third track 203 and when provided, between the second track 202', 202" and the third track 203.

The fourth track 204 comprises a first stretch 241 which extends between the first track 201 and the third track 203.

The first stretch 241 of the fourth track 204 preferably extends parallel, or substantially parallel, to the first track 201 and to the third track 203.

In particular, the first stretch 241 of the fourth track 204 comprises a plurality of peaks and troughs which extend parallel, or substantially parallel, to the peaks 11 and troughs 12 of the first track 201.

The number of peaks and troughs of the first stretch 241 preferably is equal to the number of peaks 11 and troughs 12 of the first track 201.

When the second track 202', 202" is also provided, the fourth track 204 preferably also comprises a second stretch 242 which extends between the second track 202', 202" and the third track 203.

The second stretch 242 of the fourth track 204 preferably extends parallel, or substantially parallel, to the second track 202', 202".

In particular, the second stretch 242 of the fourth track 204 comprises a plurality of peaks and troughs which extend parallel, or substantially parallel, to the peaks 21 and troughs 22 of the second track 202', 202".

The number of peaks and troughs of the second stretch 242 preferably is equal to the number of peaks 21 and troughs 22 of the second track 202.

In the second variant, the sequence of tracks, for example parallel to direction D, preferably is the following: third track 203, fourth track 204, first track 201, second track 202", fourth track 204, third track 203.

The first stretch 241 and the second stretch 242 of the fourth track 204 are joined to each other by a union stretch 243.

The fourth track 204 comprises two end portions, preferably only two end portions, each provided with two ends 4', 4" which act as pads for the connection to the electronic control unit.

The width of the fourth track 204 preferably is constant or substantially constant.

The width of the fourth track 204 preferably is between 0.5 and 2 mm.

The width of the fourth track 204 preferably is equal to, or about equal to, the width of the first track 201.

The height of the peaks of the fourth track 204 preferably is constant or substantially constant.

The height of the peaks of the fourth track 204 preferably is between 30 and 60 mm, or between 31 and 63 mm.

The first stretch 241 of the fourth track 204 preferably is equally spaced from, or about equally spaced from, the first track 201 and from the third track 203, and the second stretch 241 of the fourth track 204 is equally spaced from, or about equally spaced from, the second track 202', 202" and from the third track 203.

Figure 3A:
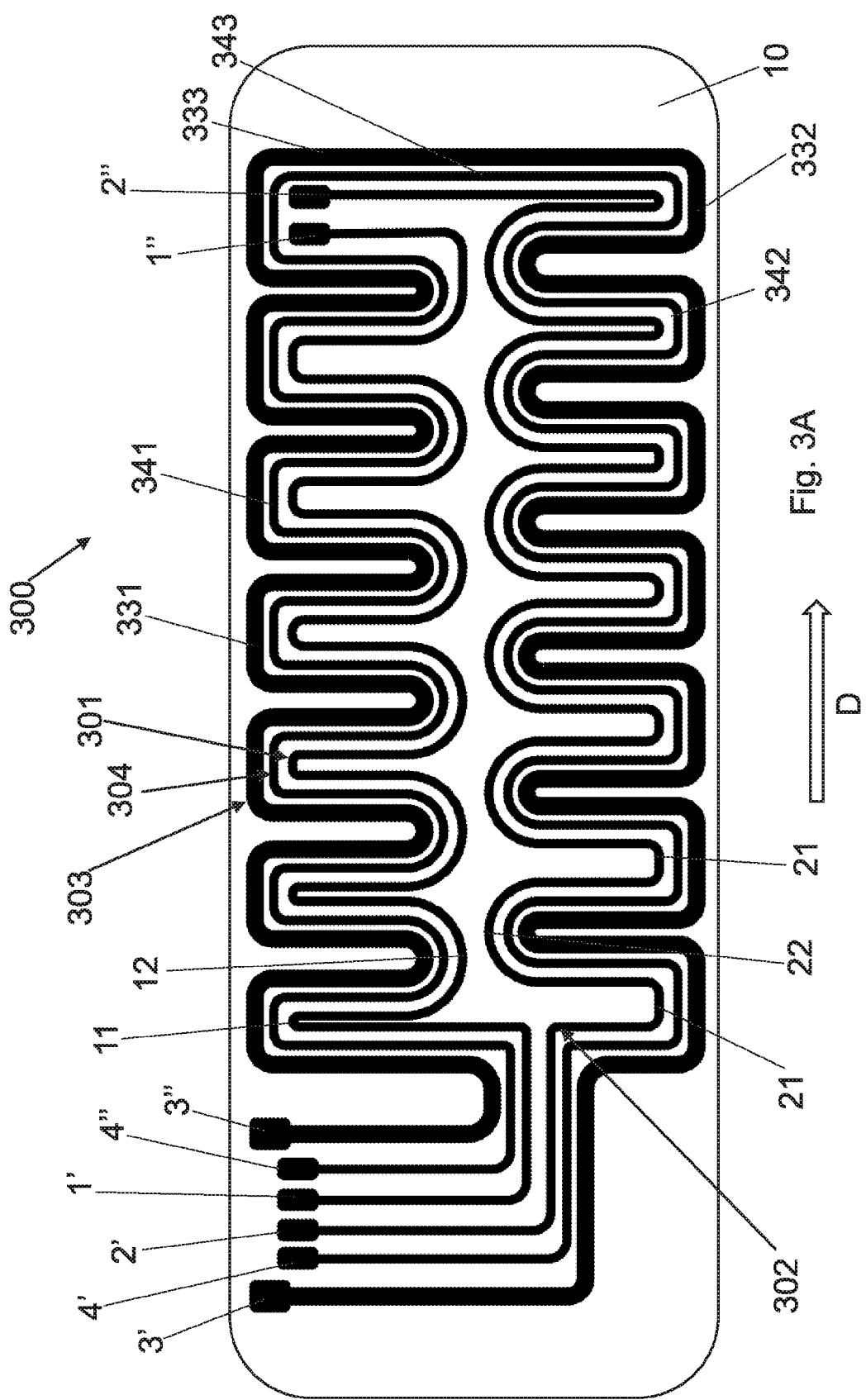
FIG. 3A shows a top plan view of a device according to a third embodiment of the invention.

With particular reference to FIGS. 3A and 3B, in a third embodiment of device 300, the aforesaid distribution of the track over the insulating support 10 so that the surface of the track adapted to come into contact with a user's hand decreases along a direction D, is obtained by means of a track 301 wherein the width a1, a2 of the peaks 11 increases along said direction D. In FIGS. 3A and 3B, in particular, the surface of the first track 301 adapted to come into contact with a user's hand decreases along direction D, in the direction indicated by the arrow. Indeed, track 301 thins out in the direction indicated by the arrow, and therefore decreases the available surface, while the track instead thickens in the direction opposite to that indicated by the arrow, and therefore increases the available surface.

As already mentioned, track 301 is adapted to act as contact sensor. For this purpose, track 301 comprises two end portions. Each end portion comprises an end 1', 1" (FIG. 3A) which acts as pad for the connection to the electronic control unit (not shown).

The aforesaid peaks 11 and the aforesaid troughs 12 extend between the ends 1', 1", in particular between the aforesaid end portions.

"Width of a peak" means the minimum distance (a1, a2 in FIG. 3B), in particular parallel to direction D, between two opposite stretches 111, 112 of the same peak 11. Preferably, but not exclusively, such stretches 111, 112 are parallel to each other, and preferably are also perpendicular to direction D, as in the example shown. Typically, but not exclusively, the stretches 111, 112 are joined to each other by the top of the peak.

Preferably, the width of the peaks 11 increases gradually peak after peak preferably along direction D in the direction indicated by the arrow in FIGS. 3A and 3B. In particular, each peak 11 preferably has a smaller width than the width of the next peak 11 along direction D in the direction indicated by the arrow in FIGS. 3A and 3B.

In FIG. 3B for example, the width of a peak 11' is indicated by "a1" and the width of the next peak 11" is indicated by "a2". Width a1 is smaller than width a2.

The difference in width between any peak 11 and the next peak 11—for example, the difference between width a2 and width a1—preferably is in a range between 0.5 and 4 mm, and preferably is a constant value.

The width of the peak 11 proximal to the end 1' (on the far left in FIG. 3A) preferably is in a range between 0.5 and 4 mm. Peak 11 proximal to end 1' preferably is the peak having the minimum width with respect to the other peaks 11.

The width of peak 11 distal from end 1' (to the far right in FIG. 3A) preferably is in a range between 3.5 and 28 mm. Peak 11 distal from end 1' (and proximal to end 1") preferably is the peak having the maximum width with respect to the other pairs of peaks 11.

Gap d between any pair of consecutive peaks 11 preferably is a constant value. "Gap" means the minimum distance, parallel to direction D, between two consecutive peaks 11. Gap "d" between the peaks 11 preferably is between 15 and 20 mm, or between 10 and 18 mm.

The height of the peaks 11 preferably is constant, or substantially constant, i.e. it is preferable for all the peaks 11 to have the same height.

The height of the peaks 11 preferably is between 30 and 60 mm.

Width "w" of track 301 preferably is constant or substantially constant. The width of track 301 preferably is between 0.5 and 2 mm.

The overall length of track 301 preferably is between 4000 and 6000 mm, such a length being measured along the whole path of track 301.

Device 300 preferably also comprises a second electrically conductive track 302 fastened to support 10. The second track 302 is distinct from the first track 301.

The second track 302 is adapted to act as contact sensor. For this purpose, track 302 comprises two end portions. Each end portion comprises an end 2', 2" which acts as pad for the connection to the electronic control unit.

Track 301 and track 302 preferably are the only tracks adapted to act as contact sensors.

The second track 302 comprises a plurality of peaks 21 alternated by a plurality of troughs 22 along the aforesaid direction D, between the ends 2', 2", in particular between the aforesaid end portions. In other words, the peaks 21 and the troughs 22 alternate with one another, whereby there is a trough 22 after a peak 21 and there is a peak 21 after a trough 22.

The width of the peaks 21 gradually decreases peak after peak preferably along direction D in the direction indicated by the arrow in FIGS. 3A and 3B. In particular, each peak 21 preferably has a greater width than the width of the next peak 21 along direction D in the direction indicated by the arrow in FIGS. 3A and 3B.

In FIG. 3B for example, the width of peak 21' is indicated by "a3" and the width of the next peak 21" is indicated by "a4". Width a3 is greater than width a4.

The difference in width between any peak 21 and the next peak 21—for example, the difference between width a3 and width a4—preferably is in a range between 0.5 and 4 mm, and preferably is a constant value.

The width of peak 21 proximal to end 1' (on the far left in FIG. 3A) preferably is in a range between 3.5 and 28 mm. Peak 21 proximal to end 1' (and distal from end 1") preferably is peak 21 having the maximum width with respect to the other peaks 21.

The width of peak 21 distal from end 1' (on the far right in FIG. 3A) preferably is in a range between 0.5 and 4 mm. Peak 21 distal from end 1' preferably is the peak 21 having the minimum width with respect to the other peaks 21.

Gap "d" between any pair of consecutive peaks 11 preferably is a constant value, and preferably is equal to the gap between the peaks 11 of the first track 301.

The height of the peaks 21 preferably is constant, or substantially constant, i.e. it is preferable that all the peaks 21 have the same height.

The height of the peaks 21 of the second track 302 preferably is equal to, or about equal to, the height of the peaks 11 of the first track 301.

The height of the peaks 21 preferably is between 30 and 60 mm.

The width of track 302 preferably is constant or substantially constant.

The width of track 302 preferably is equal to width w of track 301.

The width of track 302 preferably is between 0.5 and 2 mm.

The overall length of track 302 preferably is between 4000 and 6000 mm, such a length being measured along the whole path of track 302.

The length of the second track 302 preferably is equal to the length of the first track 301.

As shown in FIGS. 3A, 3B, the peaks 11 of the first track 301 and the peaks 21 of the second track 302 preferably extend in mutually opposite direction, in particular in height, preferably along respective directions which are perpendicular to direction D.

Also in the third embodiment, the device optionally comprises a third electrically conductive track 303 fastened to the insulating support 10.

The third track 303 is adapted to act as heating track.

The third track 303 comprises a first stretch 331 which extends parallel, or substantially parallel, to the first track 301.

In particular, the first stretch 331 of the third track 303 comprises a plurality of peaks and troughs which extend parallel, or substantially parallel, to the peaks 11 and troughs 12 of the first track 301.

The gap between the peaks of the first stretch 331 of the third track 303 preferably is constant, or substantially constant, along direction D. Alternatively, the gap between the peaks of the first stretch 331 decreases in the direction in which the width of the peaks 11 increases.

The number of peaks and troughs of the first stretch 331 preferably is equal to the number of peaks 11 and troughs 12 of the first track 301.

When the second track 302 is also provided, the third track 303 comprises a second stretch 332 which extends parallel, or substantially parallel, to the second track 302.

In particular, the second stretch 332 of the third track 303 comprises a plurality of peaks and troughs which extend parallel, or substantially parallel, to the peaks 21 and troughs 22 of the second track 302.

The gap between the peaks of the second stretch 332 of the third track 303 preferably is constant, or substantially constant, along direction D. Alternatively, the gap between the peaks of the second stretch 332 decreases in the direction in which the width of the peaks 11 increases.

The number of peaks and troughs of the second stretch 332 preferably is equal to the number of peaks 21 and troughs 22 of the second track 302.

The first stretch 331 and the second stretch 332 of the third track 303 are joined to each other by a union stretch 333.

The third track 303 comprises two end portions, preferably only two end portions, each provided with two ends 3', 3" which act as pads for the connection to the electronic control unit.

The width of the third track 303 preferably is greater than the width of the first track 301 and with respect to width of the second track 302.

The width of the third track 303 preferably is constant or substantially constant.

The width of the third track 303 preferably is between 0.5 and 4 mm.

The distance, the minimum distance in particular, between the first stretch 331 of the third track 303 and the first track 301 preferably is between 0.7 and 2.2 mm, such a distance preferably being constant or substantially constant.

The distance, the minimum distance in particular, between the second stretch 332 of the third track 303 and the second track 302 preferably is between 0.7 and 2.2 mm, such a distance preferably being constant or substantially constant.

The third track 303 preferably is proximal to the periphery, or outline, of device 300, in particular to the periphery of support 10, and the first track 301 and the second track 302 (when provided) are distal with respect to the periphery of device 300, in particular to the periphery of support 10. Alternatively in a variant not shown, the first track and the second track (when provided) optionally are proximal to the periphery of the device, in particular to the periphery of the insulating support, and the third track is distal from the periphery, or outline, of the device, in particular with respect to the periphery of the insulating support.

Device 300 preferably also comprises a fourth electrically conductive track 304 fastened to support 10.

The fourth track 304 serves as shielding track to avoid interferences, in particular capacitive couplings or electromagnetic interferences in general, between the first track 301 and the third track 303 and when provided, between the second track 302 and the third track 303.

The fourth track 304 comprises a first stretch 341 which extends between the first track 301 and the third track 303.

The first stretch 341 of the fourth track 304 preferably extends parallel, or substantially parallel, to the first track 301 and to the third track 303.

In particular, the first stretch 341 of the fourth track 304 comprises a plurality of peaks and troughs which extend parallel, or substantially parallel, to the peaks 11 and troughs 12 of the first track 301.

The number of peaks and troughs of the first stretch 341 preferably is equal to the number of peaks 11 and troughs 12 of the first track 301.

The gap between the peaks of the first stretch 341 of the fourth track 304 preferably is constant along direction D.

When the second track 302 is also provided, the fourth track 304 comprises a second stretch 342 which extends between the second track 302 and the third track 303.

The second stretch 342 of the fourth track 304 preferably extends parallel, or substantially parallel, to the second track 302.

In particular, the second stretch 342 of the fourth track 304 comprises a plurality of peaks and troughs which extend parallel, or substantially parallel, to the peaks 21 and troughs 22 of the second track 302.

The gap between the peaks of the second stretch 342 of the fourth track 304 preferably is constant along direction D.

The number of peaks and troughs of the second stretch 342 preferably is equal to the number of peaks 21 and troughs 22 of the second track 302.

The first stretch 341 and the second stretch 342 of the fourth track 304 are joined to each other by a union stretch 343.

The fourth track 304 comprises two end portions, preferably only two end portions, each provided with two ends 4', 4" which act as pads for the connection to the electronic control unit.

The width of the fourth track 304 preferably is constant or substantially constant.

The width of the fourth track 304 preferably is between 0.5 and 2 mm.

The width of the fourth track 304 preferably is equal to, or about equal to, the width of the first track 301.

The first stretch 341 of the fourth track 304 preferably is equally spaced from, or about equally spaced from, the first track 301 and from the third track 303, and the second stretch 342 of the fourth track 304 is equally spaced from, or about equally spaced from, the second track 302 and from the third track 303.

With particular reference to FIG. 4, in a fourth embodiment of a device 400, the aforesaid distribution of the track over the insulating support 10 so that the surface of the track adapted to come into contact with a user's hand decreases along a direction D, is obtained by means of a track 401 wherein the gap d1, d2 between the peaks 11 decreases along said direction D. In FIG. 4 in particular, the surface of track 401 adapted to come into contact with a user's hand decreases along direction D, in the opposite direction with respect to that indicated by the arrow. Indeed, the first track 401 thickens in the direction indicated by the arrow, and therefore increases the available surface, while it instead thins out in the opposite direction and therefore decreases the available surface.

As already mentioned, track 401 is adapted to act as contact sensor. For this purpose, track 401 comprises two end portions. Each end portion comprises an end 1', 1" (FIG. 4) which acts as pad for the connection to the electronic control unit (not shown).

The aforesaid peaks 11 and the aforesaid troughs 12 extend between the ends 1', 1", in particular between the aforesaid end portions.

The term "gap" d1, d2, d3, d4 means the minimum distance, parallel to direction D, between two consecutive peaks 11.

Preferably, the gap between the peaks 11 decreases gradually for each pair of peaks 11 along direction D in the direction indicated by the arrow in FIG. 4. In particular, preferably, each pair of peaks 11 has a greater gap with respect to the next pair of peaks 11 along direction D in the direction indicated by the arrow in FIG. 4.

In FIG. 4 for example, the gap between a first pair of peaks 11'-11" is indicated by "d1", and the gap between the next pair of peaks 11"-11'" is indicated by "d2". Gap d1 is greater than gap d2.

The difference in gaps between any pair of peaks and the next pair of peaks—for example, the difference between gap d2 and gap d1—preferably is in a range between 0.5 and 1 mm.

The difference in gaps between any pair of peaks—for example pair 11'-11"—and the next pair of peaks—for example pair 11"-11'"—preferably is equal for all the pairs of peaks 11.

The gap of the pair of peaks 11 proximal to end 1' (to the far left in FIG. 4) preferably is in a range between 25 and 30 mm. The pair of peaks 11 proximal to end 1' (and distal from end 1") preferably is the pair of peaks having the maximum gap with respect to the other pairs of peaks 11.

The gap of the pairs of peaks 11 distal from end 1' (to the far right in FIG. 3A) preferably is in a range between 0.5 and 1 mm. The pair of peaks 11 distal from end 1' preferably is the pair of peaks having the minimum gap with respect to the other pairs of peaks 11.

The height of the peaks 11 preferably is constant, or substantially constant, i.e. it is preferable for all the peaks 11 to have the same height.

The height of the peaks 11 preferably is between 30 and 60 mm.

The width of track 401 preferably is constant or substantially constant. The width of track 401 preferably is between 0.5 and 2 mm.

The peaks 11 preferably have the same width "a". "Width of a peak" means the minimum distance "a", in particular parallel to direction D, between two opposite stretches 111, 112 of the same peak 11. Preferably, but not exclusively, such stretches 111, 112 are parallel to each other, and preferably are also perpendicular to direction D, as in the example shown. Typically, but not exclusively, the stretches 111, 112 are joined to each other by the top of the peak.

The overall length of track 401 preferably is between 4000 and 6000 mm, such a length being measured along the whole path of track 401.

Device 400 preferably also comprises a second electrically conductive track 402 fastened to support 10. The second track 402 is separate from the first track 401.

The second track 402 is adapted to act as contact sensor. For this purpose, track 402 comprises two end portions. Each end portion comprises an end 2', 2" which acts as pad for the connection to the electronic control unit.

Track 401 and track 402 preferably are the only tracks adapted to act as contact sensors.

The second track 402 comprises a plurality of peaks 21 alternated by a plurality of troughs 22 along the aforesaid direction D, between the ends 2', 2", in particular between the aforesaid end portions. In other words, the peaks 21 and the troughs 22 alternate with one another, whereby there is a trough 22 after a peak 21 and there is a peak 21 after a trough 22.

The gap between the peaks 21 gradually increases for each pair of peaks 21 preferably along direction D in the direction indicated by the arrow in FIG. 4. In particular, each pair of peaks 21 preferably has a smaller gap with respect to the next pair of peaks 21 along direction D in the direction indicated by the arrow in FIG. 4.

In FIG. 4 for example, the gap between a first pair of peaks 21'-21" is indicated by "d3", and the gap between the next pair of peaks 21"-21''' is indicated by "d4". Gap d3 is smaller than gap d4.

The difference in gaps between any pair of peaks 21 and the next pair of peaks 21 preferably is in a range between 0.5 and 1 mm.

The difference in gaps between a pair of peaks 21 and the next pair of peaks 21 preferably is equal for all the pairs of peaks 21.

The difference in gaps between any pair of peaks 21 and the next pair of peaks 21 preferably is equal to the difference in gaps between any pair of peaks 11 and the next pair of peaks 11 of the first track 401.

The gap of the pair of peaks 21 proximal to end 1' (to the far left in FIG. 4) preferably is in a range between 25 and 30 mm. The pair of peaks 21 proximal to end 1' preferably is the pair of peaks having the minimum gap with respect to the other pairs of peaks 21.

The gap of the pairs of peaks 21 distal from end 1' (to the far right in FIG. 4) preferably is in a range between 0.5 and 1 mm. The pair of peaks 21 distal from end 1' (and proximal to end 1") preferably is the pair of peaks having the maximum gap with respect to the other pairs of peaks 21.

The peaks 21 preferably have the same width "a", which preferably is equal to the width of the peaks 11 of the first track 401.

The height of the peaks 21 preferably is constant, or substantially constant, i.e. it is preferable for all the peaks 21 to have the same height.

The height of the peaks 21 of the second track 402 preferably is equal to, or about equal to, the height of the peaks 11 of the first track 401.

The height of the peaks 21 preferably is between 30 and 60 mm.

The width of track 402 preferably is constant or substantially constant.

The width of track 402 preferably is equal to width w of track 401.

The width of track 402 preferably is between 0.5 and 2 mm.

The overall length of track 402 preferably is between 4000 and 6000 mm, such a length being measured along the whole path of track 402.

The length of the second track 402 preferably is equal to the length of the first track 401.

As shown in FIG. 4, the peaks 11 of the first track 401 and the peaks 21 of the second track 402 preferably extend in mutually opposite direction, in particular in height, preferably along respective directions which are transverse, preferably perpendicular, to direction D.

In general, in all embodiments, the device 100, 200', 200", 300, 400 is flexible. Device 100, 200', 200", 300, 400 belongs to the field of flexible electronics and may also be called flexible circuit or "Flex Foil".

Preferably, but not exclusively, the tracks are incorporated in the insulating support 10. For example, the tracks are arranged between two layers of insulating support 10 fastened to each other, thus substantially forming a sandwich structure.

One of the two layers of the insulating support 10 may be arranged on the body of the steering wheel 9 (for example, on the metal skeleton of the steering wheel or on another layer, for example made of polyurethane or another thermohardening/thermoplastic element of the body of the steering wheel), and the other insulating layer may be covered with a covering layer, made of leather for example. Thereby, the covering layer advantageously does not have protrusions due to the conductive tracks.

The tracks may alternatively be fastened to a surface, for example an outer face, of the insulating support 10.

Device 100, 200', 200", 300, 400 preferably has an overall thickness between 0.1 and 1 mm, for example between 0.1 and 0.6 mm, or between 0.3 and 1 mm, or between 0.3 and 0.6 mm; for example, the thickness is equal to about 0.3 mm or is equal to about 0.6 mm.

The overall thickness of device 100, 200', 200", 300, 400 preferably is much smaller than the maximum length and the maximum width thereof, where such length and width substantially correspond to the maximum length and the maximum width of the insulating support 10. For example, the length of device 100, 200', 200", 300, 400 may be between 900 and 1200 mm and the width may be between 80 and 160 mm, or between 80 and 100 mm. The dimensions of device 100, 200', 200", 300, 400 may in any case be selected according to the dimensions of any steering wheel on which it is provided for device 100, 200', 200", 300, 400 to be applied.

The material with which the insulating support 10 is made preferably is a polymeric material. By mere way of non-limiting example, the insulating support 10 may comprise or be made of silicone, PVC, PS, PP, PE, PC, ABS, PET, PA, PU, PUR, NBR, PTFE, EPDM and the like, optionally with additives. The insulating support preferably comprises or is made of PVC.

By mere way of non-limiting example, each conductive track may comprise or be made of aluminum, constantan, copper, German silver, steel, Inconel, brass and the like. The conductive tracks preferably are made of aluminum. The conductive tracks preferably each have a thickness between 10 and 200 μm, for example between 15 and 150 μm.

By mere way of non-limiting example, device 100, 200', 200", 300, 400 may be made by means of etching a foil fastened to support 10, or by crosslinking a silicone support on which there are arranged one or more of the aforesaid conductive tracks obtained by means of cutting, e.g. laser cutting.

Preferably, device 100, 200', 200", 300, 400, support 10 in particular, is extensible, being plastically and/or elastically deformable, up to about 10-20% with respect to a resting configuration or initial configuration.

By mere way of non-limiting example, a device 100 according to the first embodiment may be fastened to the steering wheel 9 as described below, referring in particular to FIGS. 5A, 5B, 5C.

The steering wheel 9 for example, is shown in FIGS. 5A and 5C in a position in which the wheels of the vehicle are straight, i.e. a position in which the vehicle may advance substantially in a straight line.

FIG. 5A is a front frontal view, while FIG. 5C is a rear frontal view.

FIGS. 5A and 5C also indicate direction D along which the surface of the first track 101 adapted to come into contact with a user's hand when device 100 is arranged on the steering wheel 9, decreases. In particular, the surface of the first track 101 adapted to come into contact with a user's hand decreases in the direction in FIGS. 5A, 5C. Typically, but not exclusively, direction D depends on the shape of the steering wheel 9. Typically, but not exclusively, direction D is parallel to the perimeter of the steering wheel 9. For example, when device 100 is applied to a circular steering wheel 9, direction D substantially is circular.

For illustrative purposes, axis Y is indicated, which divides the steering wheel 9 in half, in particular into a left-hand part 93 and into a right-hand part 94, where "left-hand" and "right-hand" refer to a front frontal view of the steering wheel 9 (FIG. 5A).

The front part of the steering wheel 9 is indicated by numeral 91, while the rear part is indicated by numeral 92. The front part 91 faces the driver.

The left-hand part 93 and the right-hand part 94 each comprise half of the front part 91 and half of the rear part 92.

Device 100 is positioned so that the first track 101 is arranged at the front part 91 of the steering wheel 9 and so that the second track 102 (when provided) is arranged at the rear part 92 of the steering wheel 9.

In greater detail, peak 11a of the first track 101 having the maximum height is arranged in the front part 91 of the left-hand part 93, preferably close to axis Y. The position of such a peak 11a is diagrammatically indicated by the dotted line which ends with a dot in FIG. 5A.

Peak 11b of the first track 101 having the minimum height is arranged in the front part 91 of the right-hand part 94, close to axis Y. The position of such a peak 11b is diagrammatically indicated by the dotted line which ends with a square in FIG. 5A.

Peak 21a of the second track 102 having the minimum height is arranged in the rear part 92 of the left-hand part 93 (looking at the steering wheel from the front), close to axis Y. The position of such a peak 21a is diagrammatically indicated by the dotted line which ends with a dot in FIG. 5C. Therefore, peak 21a of the second track 102 substantially is opposite to peak 11a of the first track 101.

Peak 21b of the second track 102 having the maximum height is arranged in the rear part 92 of the right-hand part 94 (looking at the steering wheel from the front), close to axis Y. The position of such a peak 21" is diagrammatically indicated by the dotted line which ends with a square in FIG. 5C. Therefore, peak 21b of the second track 102 substantially is opposite to peak 11b of the first track 101.

The arrangement of device 100 just described also holds true for the devices 200', 300 and 400, respectively, according to the second embodiment (first variant), the third and fourth embodiments.

For the device 200" according to the second variant of the second embodiment, the first track and the second track are arranged at the front part 91 and the rear part 92 of the steering wheel 9.

Optionally, only a portion of the steering wheel, for example from 70% to 80% of the steering wheel, is provided with a device 100, 200', 200", 300, 400. Thereby, any contact between other parts of the driver's body (e.g. his/her knees) and the steering wheel are not detected.

By mere way of non-limiting example, with reference to the following tables and FIGS. 6A, 6B, 6C, 7A, 7B, 7C, 8A, 8B, 8C, a method is described for operating a device 100 according to the first embodiment in which both the first track 101 and the second track 102 are provided.

Such an operating method is also applicable to the devices 200', 300 and 400.

TABLE

| Contact method | S1 (101) | S2 (102) | S1 AND S2 | S1 OR S2 |
|---|---|---|---|---|
| No. 1 Palm Left Touch | H | 0 | FALSE | TRUE |
| No. 1 Palm Right Touch | L | 0 | FALSE | TRUE |
| No. 2 Palm Left Touch | H + H | 0 | FALSE | TRUE |
| No. 2 Palm Right Touch | L + L | 0 | FALSE | TRUE |
| No. 1 Palm Left Touch + No. 1 Palm Right Touch | H + L | 0 | FALSE | TRUE |
| No. 1 Grip Left Touch | H | L | TRUE | TRUE |
| No. 1 Grip Right Touch | L | H | TRUE | TRUE |
| No. 2 Grip Left Touch | H + H | L + L | TRUE | TRUE |
| No. 2 Grip Right Touch | L + L | H + H | TRUE | TRUE |
| No. 1 Grip Left Touch + No. 1 Grip Right Touch | H | H | TRUE | TRUE |

Device 100 is connected to an electronic control unit suitably programmed to execute such a method, thus forming a system or apparatus.

The method provides defining a threshold value for an electrical quantity, e.g. the capacitance.

With respect to such a threshold value, following the contact, also indirect contact, there may be a high variation of capacitance (indicated by letter "H" in the table), i.e. much greater than the threshold value, or a low variation of capacitance (indicated by letter "L" in the table), i.e. slightly greater than the threshold value, between the hand and the first track 101, according to the area where the contact occurs.

Similarly with respect to such a threshold value, following the contact between the hand and the second track 102, there may be a high variation of capacitance (H), i.e. much greater than the threshold value, or a low variation of capacitance (L), i.e. slightly greater than the threshold value, according to the area where the contact occurs. For example, the difference between a value H and the threshold value is between 8 and 20 pF (pico-Farad), and the difference between the value L and the threshold value is between 2 and 4 pF.

The capacitance value read by the electronic control unit advantageously varies according to the position in which the contact with the steering wheel 9 occurs.

It is to be understood that the contact between the hand and the first track and/or the second track 102 may also be an indirect contact. The contact preferably is indirect, i.e. the driver's hand touches an outer covering layer of the steering wheel, below which the device 100 is provided, and in particular below which there are the tracks 101, 102.

The threshold value preferably is the same for the two tracks 101, 102.

The threshold value is selected according to the variation of capacitance at the minimum touch value to be detected (e.g. 2 fingers), i.e. the minimum touch contact surface.

The table makes reference to a "Palm Left Touch" and "Palm Right Touch", which indicate a contact only with the palm of a hand, in particular an open palm, in the front part 91 of the left-hand part 93 and in the front part 91 of the right-hand part 94, respectively, of the steering wheel 9.

Under these conditions, the driver only touches the front part 91 of the steering wheel, and therefore touches, also indirectly, only the first track 101.

The table makes reference to a "Grip Left Touch" and "Grip Right Touch", which indicate a grip, in particular with a closed hand, in the left-hand part 93 and in the right-hand part 94, respectively, of the steering wheel 9.

Under the condition of a grip of the steering wheel with a closed hand, the hand is in contact both with the front part 91, and therefore touches, preferably indirectly touches, the first track 101, and with the rear part 92, and therefore touches, preferably indirectly touches, the second track 102.

In the table, "N" followed by number "1" or by number "2" indicates the number of hands with which the contact occurs with the steering wheel 9.

FIGS. 6A, 6B, 6C schematize a condition of "No. 1 Palm Left Touch" (contact to the left, with one hand alone with an open palm). The contact area Z1' with the steering wheel 9 is shown diagrammatically in FIG. 6A with a rectangle, and the respective contact area Z1" with the first track 101 is diagrammatically indicated by a rectangle in FIG. 6B.

With reference to the first line in the table, under this condition, the variation of capacitance relative to the first track 101 read by the electronic control unit is "high" (H, column S1) with respect to the threshold value, while the variation of capacitance relative to the second track 102 substantially is equal to zero (0, column S2). Therefore, the following logical relations exist: "S1 and S2=False" and "S1 or S2=True", i.e. it may be determined that there is no contact with both tracks, rather only with one of the two tracks, in particular only with track 101.

Moreover, since the variation value of capacitance is high, an indication may be obtained of the area in which the contact occurs, which here is in the left-hand part 93.

FIGS. 7A, 7B, 7C schematize a condition of "No. 1 Grip Left Touch" (sixth line in the table), i.e. a grip of the steering wheel to the left, with one hand alone. The contact areas Z2' and Z2" with the steering wheel 9 are shown with a rectangle in FIGS. 7A and 7C, respectively, and the respective contact area Z2''' with the first track 101 and with the second track 102 are indicated by a rectangle in FIG. 7B. It is worth noting that the surface of the first track 101 enclosed in rectangle Z2''' is greater than the surface of the second track 102 enclosed in the same rectangle Z2'''. Therefore, the absolute variation value of capacitance related to the first track 101 is high (H, column S1) and in any case, is greater than the absolute variation value of capacitance related to the second track 102, the latter being low (L, column S2).

Therefore, the following logical relations exist: "S1 and S2=True" and "S1 or S2=True", i.e. it may be determined that there is contact with both the tracks 101, 102.

Moreover, since the variation value of capacitance related to the first track 101 is high, while the variation value of capacitance related to the second track 102 is low (i.e. the difference between the capacitance value of the first track 101 and the second track 102 is positive), it may be determined that the grip is occurring in the left-hand part 93 of the steering wheel.

With reference to the last line of the table, FIGS. 8A, 8B and 8C schematize the condition of "No. 1 Grip Left Touch+No. 1 Grip Right Touch", i.e. of a grip with two hands, of which one hand arranged on the left-hand part 93 and one hand arranged on the right-hand part 94.

In this case, the variation value of capacitance related to the first track 101 is high because it is given by the sum of a high value (left-hand part 93) and of a low value (right-hand part 94). Moreover, also the variation value of capacitance related to the first track 102 is high because it is given by the sum of a low value (left-hand part 93) and of a high value (right-hand part 94).

The fourth line of the table summarizes a condition of "No. 2 Palm Right Touch", i.e. in which the driver touches the steering wheel only with his/her palm, with two hands only arranged in the right-hand part 94, close to axis Y. Here, there is the sum of two low values (L+L, column S1).

If the devices 100, 200', 300 and 400 are provided with one conductive track 101, 201, 301, 401 only, preferably arranged on the front part 91, and in the case of device 200" (second variant of the second embodiment) in which the two conductive tracks 201 and 202" are both preferably arranged on the front part 91, the position where the contact with the steering wheel 9 occurs may in any case be determined.

In general, in all embodiments in which there are provided two sensor tracks, for example the tracks 101 and 102, the capacitance value C1 of track 101 and the capacitance value C2 of track 102 may be processed using the formula:

$$(C1-C2)/(C1+C2).$$

This formula allows normalizing the difference (C1−C2) with respect to the entity of the touch. In other words, it allows always having a result between −1 and 1, regardless of the absolute value of C1 and C2.

The result is used for detecting the position of the touch.

For example, considering a contact with one hand only, the result of the formula tends to be 1, the closer the proximity to peak 11a (maximum height); moreover, the result of the formula tends to be −1, the closer the proximity to peak 11b (minimum height) and tends to be 0, the closer the proximity to the middle of device 100.

Note that, preferably, the end values of the value ranges indicated in this description are included.

What is claimed is:

1. A device for detecting contact between a user and a steering wheel of a vehicle, the device comprising:
an electrically insulating support;
a first electrically conductive track fastened to the electrically insulating support and including a plurality of first peaks alternated with a plurality of first troughs along a direction, and
wherein the first electrically conductive track is distributed over the electrically insulating support such that a surface of the first electrically conductive track, which is adapted to come into contact with a user's hand, decreases along said direction.

2. The device according to claim 1, wherein a height of each one of the plurality of first peaks and/or a width of the first electrically conductive track decreases along said direction.

3. The device according to claim 1, wherein there is provided a second electrically conductive track fastened to the electrically insulating support and comprising a plurality of second peaks alternated with a plurality of second troughs along said direction;
wherein the second electrically conductive track is distributed over the electrically insulating support so that a surface of the second electrically conductive track adapted to come into contact with a user's hand increases along said direction, in opposite direction with respect to the first electrically conductive track.

4. The device according to claim 3, wherein a height of each one of the plurality of first peaks decreases along said direction and wherein a height of each one of the plurality of second peaks increases along said direction.

5. The device according to claim 3, wherein a width of the first electrically conductive track decreases along said direction and a width of the second electrically conductive track increases along said direction.

6. The device according to claim 3, wherein a width of each one of the plurality of first peaks increases along said direction and a width of each one of the plurality of second peaks decreases along said direction.

7. The device according to claim 3, wherein a gap between adjacent ones of the plurality of first peaks increases along said direction and wherein a gap between adjacent ones of the plurality of second peaks decreases along said direction.

8. The device according to claim 3, wherein the plurality of first peaks and the plurality of second peaks extend in a mutually opposite direction.

9. The device according to claim 3, wherein the plurality of first peaks and the plurality of second peaks extend in a same direction.

10. The device according to claim 3 further comprising a third electrically conductive track fastened to the electrically insulating support and including a first stretch which extends substantially parallel to the first electrically conductive track and wherein, the third electrically conductive track includes a second stretch which extends substantially parallel to the second electrically conductive track.

11. The device according to claim 10 further comprising a fourth electrically conductive track fastened to the electrically insulating support, including a first stretch which extends substantially parallel to the first electrically conductive track, between the first electrically conductive track and the third electrically conductive track and wherein, the fourth electrically conductive track includes a second stretch which extends substantially parallel to the second electrically conductive track, between the second electrically conductive track and the third electrically conductive track.

12. The device according to claim 3, wherein the first electrically conductive track is adapted to be arranged at a front part of the steering wheel and wherein said second electrically conductive track is adapted to be arranged at a rear part of the steering wheel.

13. A device according to claim 3, comprising an electronic control unit connected to the first electrically conductive track and to the second electrically conductive track.

14. The device according to claim 1 further comprising an electronic control unit connected at least to the first electrically conductive track.

15. A steering wheel of a vehicle, wherein at least one part of the steering wheel is provided with at least one device according to claim 1.

16. The steering wheel according to claim 15, wherein the first electrically conductive track is arranged at a front part of the steering wheel.

17. The steering wheel according to claim 15, wherein the device is provided with a second electrically conductive track fastened to the electrically insulating support and comprising a plurality of second peaks alternated with a plurality of second troughs along said direction,
wherein the second electrically conductive track is distributed over the electrically insulating support so that a surface of the second electrically conductive track adapted to come into contact with a user's hand increases along said direction, in opposite direction with respect to the first electrically conductive track;
wherein the first electrically conductive track is arranged at a front part of the steering wheel and wherein said second electrically conductive track is arranged at a rear part of the steering wheel.

18. The device according to claim 1, wherein a width of the plurality of first peaks increases along said direction.

19. The device according to claim 1, wherein a gap between adjacent ones of the plurality of first peaks increases along said direction.

* * * * *